United States Patent
Seshita et al.

(10) Patent No.: US 10,965,256 B2
(45) Date of Patent: Mar. 30, 2021

(54) HIGH-FREQUENCY AMPLIFIER CIRCUITRY AND SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Toshiki Seshita, Kanagawa (JP); Yasuhiko Kuriyama, Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 46 days.

(21) Appl. No.: 16/535,175

(22) Filed: Aug. 8, 2019

(65) Prior Publication Data

US 2020/0259464 A1    Aug. 13, 2020

(30) Foreign Application Priority Data

Feb. 7, 2019    (JP) .............................. JP2019-020723

(51) Int. Cl.
*H03F 1/32* (2006.01)
*H03F 3/195* (2006.01)
*H03F 1/56* (2006.01)

(52) U.S. Cl.
CPC ........... *H03F 1/3205* (2013.01); *H03F 1/565* (2013.01); *H03F 3/195* (2013.01);
(Continued)

(58) Field of Classification Search
CPC ........ H03F 1/3205; H03F 3/195; H03F 1/565; H03F 2200/294; H03F 2200/222;
(Continued)

(56) References Cited

U.S. PATENT DOCUMENTS

| 7,696,828 B2 | 4/2010 | Chang |
| 7,902,925 B2 | 3/2011 | Kim et al. |

(Continued)

FOREIGN PATENT DOCUMENTS

| JP | 2008-236211 A | 10/2008 |
| JP | 2009-504096 A | 1/2009 |

(Continued)

OTHER PUBLICATIONS

Toshiki Seshita et al., U.S. Appl. No. 16/290,074; entitled "High-Frequency Amplifier Circuitry and Semiconductor Device", filed Mar. 1, 2019.

*Primary Examiner* — Hieu P Nguyen
(74) *Attorney, Agent, or Firm* — White & Case LLP

(57) ABSTRACT

Circuitry includes an amplifier circuit having a first transistor, an inductor, and a second transistor, and a distortion compensation circuit having a third transistor, a forth transistor, and a first capacitor. The first transistor is applied input signal. The inductor is connected to a source of the first transistor and grounded on another side. The second transistor has a source connected to a drain of the first transistor, a grounded gate and a drain connected to a power supply, and outputs an amplified signal. The third transistor has a drain and a gate connected to the drain, and is connected to the power supply on the drain. The fourth transistor has a drain and a gate connected to a source of the third transistor, and is grounded on a source. The first capacitor connects nodes between the drain of the first transistor and the source of the third transistor.

18 Claims, 22 Drawing Sheets

(52) U.S. Cl.
CPC .. *H03F 2200/222* (2013.01); *H03F 2200/294* (2013.01); *H03F 2200/387* (2013.01); *H03F 2200/451* (2013.01)

(58) Field of Classification Search
CPC ......... H03F 2200/387; H03F 2200/451; H03F 1/223; H03F 3/193; H03F 1/26; H03F 1/0205
USPC ................................ 330/149, 311, 302, 296
See application file for complete search history.

(56) References Cited

U.S. PATENT DOCUMENTS

| | | |
|---|---|---|
| 9,337,777 B2 | 5/2016 | Kim |
| 10,541,654 B1 * | 1/2020 | Snai ........................ H03F 3/245 |
| 10,566,937 B2 * | 2/2020 | Mehrjoo ................. H03F 3/245 |
| 2020/0007094 A1 | 1/2020 | Seshita et al. |

FOREIGN PATENT DOCUMENTS

| | | |
|---|---|---|
| JP | 2011-509048 A | 3/2011 |
| JP | 4838308 B2 | 12/2011 |
| JP | 5237392 B2 | 7/2013 |
| JP | 5979160 B2 | 8/2016 |
| JP | 2020-5177 A | 1/2020 |

* cited by examiner

HIGH-FREQUENCY AMPLIFIER CIRCUITRY AND SEMICONDUCTOR DEVICE

CROSS REFERENCE TO RELATED APPLICATIONS

This application is based upon and claims the benefit of priority from the prior Japanese Patent Application No. 2019-020723, filed on Feb. 7, 2019, the entire contents of which are incorporated herein by reference.

FIELD

The embodiment of the present invention relate to high-frequency amplifier circuitry and a semiconductor device.

BACKGROUND

For a Low Noise Amplifier (LNA), generally, a SiGe bipolar process is used, and the one made by a CMOS process on a Silicon On Insulator (SOI) substrate increases recently. This is because a high functional circuit can be realized by incorporating a high-frequency switch FET in the LNA. In recent years, Carrier Aggregation (CA) is introduced to speed up the radio communication. To cope with the carrier aggregation, there is a growing demand for Third Order Input Intercept Point (IIP3) recently.

DETAILED DESCRIPTION

Figure 1:
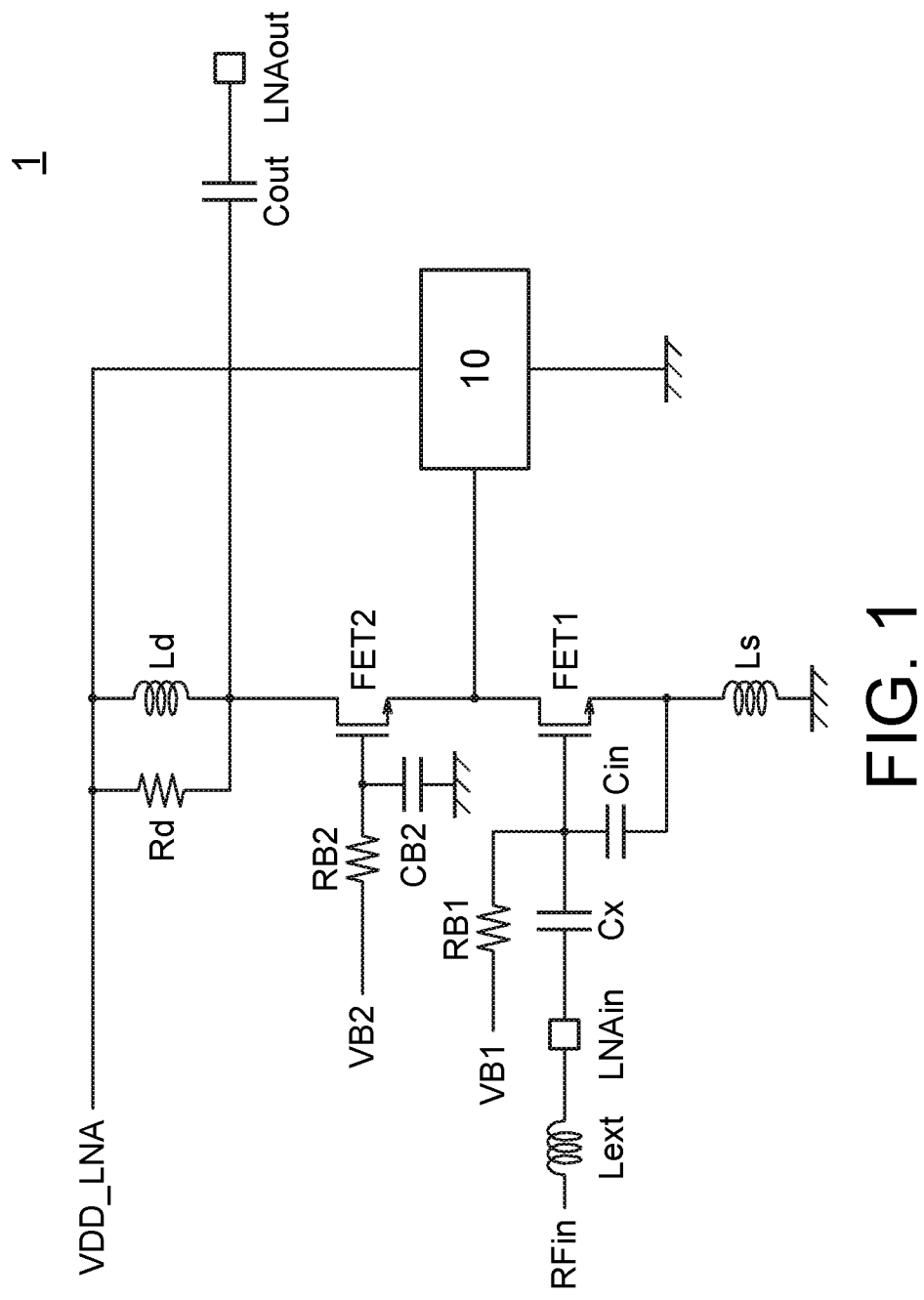
FIG. 1 is a diagram illustrating an LNA according to an embodiment.

According to one embodiment, a high-frequency amplifier circuitry includes an amplifier circuit and a distortion compensation circuit. The amplifier circuit includes a first transistor, an inductor, and a second transistor. The first transistor has a gate to which an input signal is applied. The inductor has one terminal which is connected to a source of the first transistor and another terminal which is grounded. The second transistor has a source which is connected to a drain of the first transistor, a gate which is grounded, and a drain which is connected to a power supply voltage terminal, and is configured to output from the drain a signal obtained by amplifying the input signal. The distortion compensation circuit includes a third transistor, a forth transistor, and a first capacitor. The third transistor has a drain and a gate which are connected to each other, the third transistor connected to the power supply voltage terminal on the drain side. The fourth transistor has a drain and a gate which are connected to a source of the third transistor, and is grounded on a source side. The first capacitor connects nodes between the drain of the first transistor and the source of the second transistor, and, the source of the third transistor.

Embodiments will now be explained with reference to the drawings. Note that though the embodiments are explained and illustrated with some components omitted, modified or simplified in this specification and the attached drawings for convenience of easy understanding and illustration, the technical contents at the level in which the same functions can be expected will be interpreted while being included in the embodiments. Further, in the drawings attached to this specification, the scale and the aspect ratio and so on are changed from the original size and exaggerated for convenience of illustration and easy understanding.

FIG. 1 is a diagram illustrating a configuration of an LNA to be explained in this specification. An LNA1 includes: an amplifier circuit having a grounded-source first transistor FET1 and a grounded-gate second transistor FET2 which are cascode-connected; and an IIP3 compensation circuit (distortion compensation circuit) 10. The amplifier circuit may include capacitors Cx, Cin and a source inductor Ls as input matching elements, and may include a capacitor Cout, a resistor Rd, and an inductor Ld as output matching elements. The amplifier circuit may further include resistors RB1, RB2 to prevent a high-frequency signal from flowing to a bias potential generation circuit.

The first transistor FET1 includes the source inductor Ls between its source and a ground point, and functions as a grounded-source transistor having inductive source degeneration. The capacitor Cx is connected between the gate of the first transistor FET1 and an input terminal LNAin, and the capacitor Cin is connected between the gate and the source.

The second transistor FET2 has a gate to which a capacitor CB2 is connected, and functions (in a high-frequency manner) as a grounded-gate transistor. The second transistor FET2 has a source connected to the drain of the first transistor FET1 and a drain connected to an output port via an output matching circuit, and amplifies the high-frequency signal inputted from the drain of the first transistor FET1 and outputs the amplified signal.

The source inductor Ls, the capacitors Cx, Cin, and an external inductor Lext provided in the external part of the LNA1 function as the input matching elements. The input matching elements achieve desired impedance matching taking gain matching and noise matching of an amplifying transistor into account. The capacitor Cx also serves as a function of blocking a direct-current component. Besides, the capacitor Cin is not always a necessary component, and becomes an unnecessary component, for example, depending on a frequency band. The capacitor Cin is omitted in the following explanation, but the same explanation is applicable to a configuration including the capacitor Cin.

An amplifier circuit including the first transistor FET1, the second transistor FET2, and the source inductor Ls is formed. The amplifier circuit may further include the following circuit elements.

Between the drain of the second transistor FET2 and a power supply node VDD_LNA (power supply voltage terminal or an output of an internal voltage regulator), the inductor Ld is connected, and the resistor Rd is connected in parallel with the Ld. Between the drain of the second transistor FET2 and an output terminal LNAout, the capacitor Cout is connected. The inductor Ld, the resistor Rd, and the capacitor Cout form the output matching circuit. The resistor Rd is provided for gain adjustment and stabilization.

From the not-illustrated bias potential generation circuit, a bias potential VB1 to the gate of the first transistor FET1, a bias potential VB2 to the gate of the second transistor FET2, and a bias potential VDD_LNA to the drain of the second transistor FET2 are supplied. Note that the resistors RB1, RB2 are provided to prevent the high-frequency signal from being transmitted to the bias potential generation circuit.

The IIP3 compensation circuit 10 is a distortion compensation circuit provided to realize distortion compensation of the LNA1, in particular, excellent IIP3 characteristics for the amplifier circuit which amplifies the input signal and outputs the amplified signal. The IIP3 compensation circuit (distortion compensation circuit) is connected to the power supply node VDD_LNA being an output of an internal voltage regulator and to a node between the drain of the first transistor FET1 and the source of the second transistor FET2. The IIP3 compensation circuit 10 generates reverse distortion with respect to the distortion of the signal generated in the LNA1 and compensate the distortion to thereby improve the IIP3. For example, the IIP3 compensation circuit 10 is provided with a transistor and a capacitor to generate third-order intermodulation distortion having reverse characteristics to those of third-order intermodulation distortion generated in the case where the IIP3 compensation circuit 10 is not provided. Hereinafter, embodiments of the IIP3 compensation circuit 10 will be explained. The detailed operation of the LNA1 will be omitted.

As explained above, the LNA1 according to the embodiments explained below includes an amplifier circuit, and an IIP3 compensation circuit (distortion compensation circuit) connected to the amplifier circuit. The IIP3 compensation circuit (distortion compensation circuit) includes at least a third transistor which has a drain and a gate connected to each other and is connected to a power supply voltage terminal on a drain side, a fourth transistor which has a drain and a gate connected to the source of the third transistor and is grounded on a source side, and a first capacitor which connects a node between the transistors of the amplifier circuit and the source of the third transistor.

Note that each matching circuit element is illustrated as an example, and is not an essential point in the embodiments explained below. In other words, the output matching circuit element may have another configuration and may be provided outside the LNA1 in a broad sense.

The relationship with the gate width of the transistor will be illustrated together with a circuit diagram. Wg indicates the gate width and is given the same index as that of the corresponding transistor to indicate which transistor has the gate width. For example, the gate width of the third transistor FET3 is described as Wg3, and the gate width of the fourth transistor FET4 is described as Wg4. The same applies to the drawings. The electrostatic capacitance of a capacitor is replaced, for description, by the name of the capacitor. For example, the electrostatic capacitance of a capacitor C1 is simply described as C1. The resistance value is similarly replaced, for description, by the name of the resistor.

First Embodiment

Figure 2:
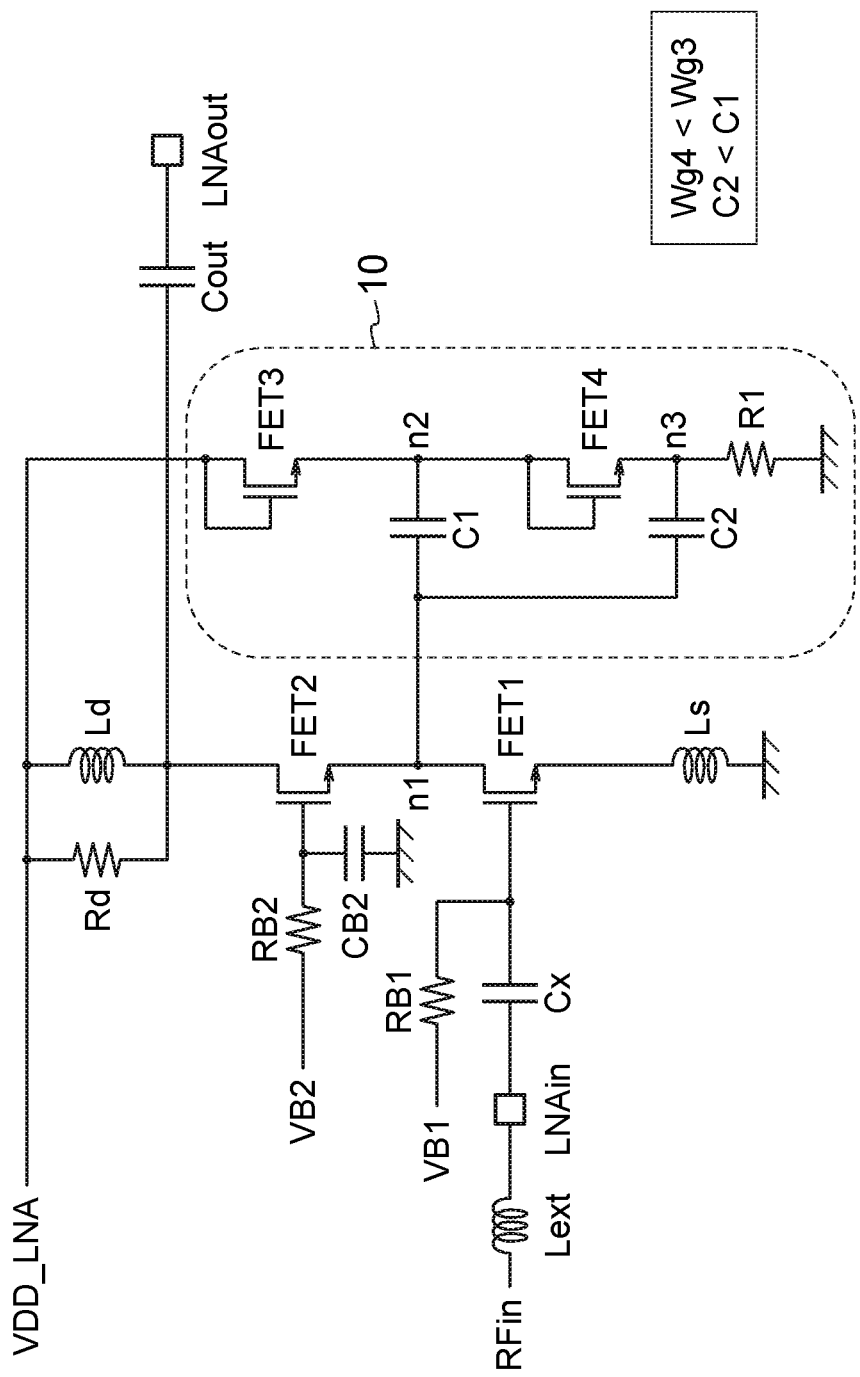
FIG. 2 is a diagram illustrating an LNA according to one embodiment.

FIG. 2 is a diagram illustrating an LNA1 according to this embodiment. In the LNA1 according to this embodiment, an IIP3 compensation circuit (distortion compensation circuit) 10 includes a third transistor FET3, a fourth transistor FET4, and a first resistor R1 which are connected in series between a power supply node VDD_LNA being an output of an internal voltage regulator and the ground point, and further includes a first capacitor C1 and a second capacitor C2.

The third transistor FET3 has a drain and a gate connected to each other, and the drain and the gate are connected to the power supply node VDD_LNA. The fourth transistor FET4 has a drain and a gate connected to each other, and the drain and the gate are connected to the source of the third transistor FET3. The first resistor R1 has one terminal connected to a source of the fourth transistor FET4 and is grounded at another terminal. In other words, the fourth transistor FET4 has the source grounded via the first resistor R1.

The capacitor C1 connects a first node n1 between a drain of a first transistor FET1 and a source of a second transistor FET2 and a second node n2 between the source of the third transistor FET3 and the drain of the fourth transistor FET4. The second capacitor C2 connects the first node n1 and a third node n3 between the source of the fourth transistor FET4 and the first resistor R1.

In this embodiment, the gate widths of the third transistor FET3 and the fourth transistor FET4 satisfy Wg4<Wg3, and the electrostatic capacitances thereof satisfy C2<C1.

For example, regarding each transistor, the gate oxide film thickness is 2.5 nm, the gate length is 0.14 um, the threshold voltage is 0.37 V, Wg1 and Wg2 are 300 um, Wg3 is 15 um, Wg4 is 5 um, R1 is 4.1 kΩ, C1 is 0.34 pF, and C2 is 0.12 pF.

Figure 3:
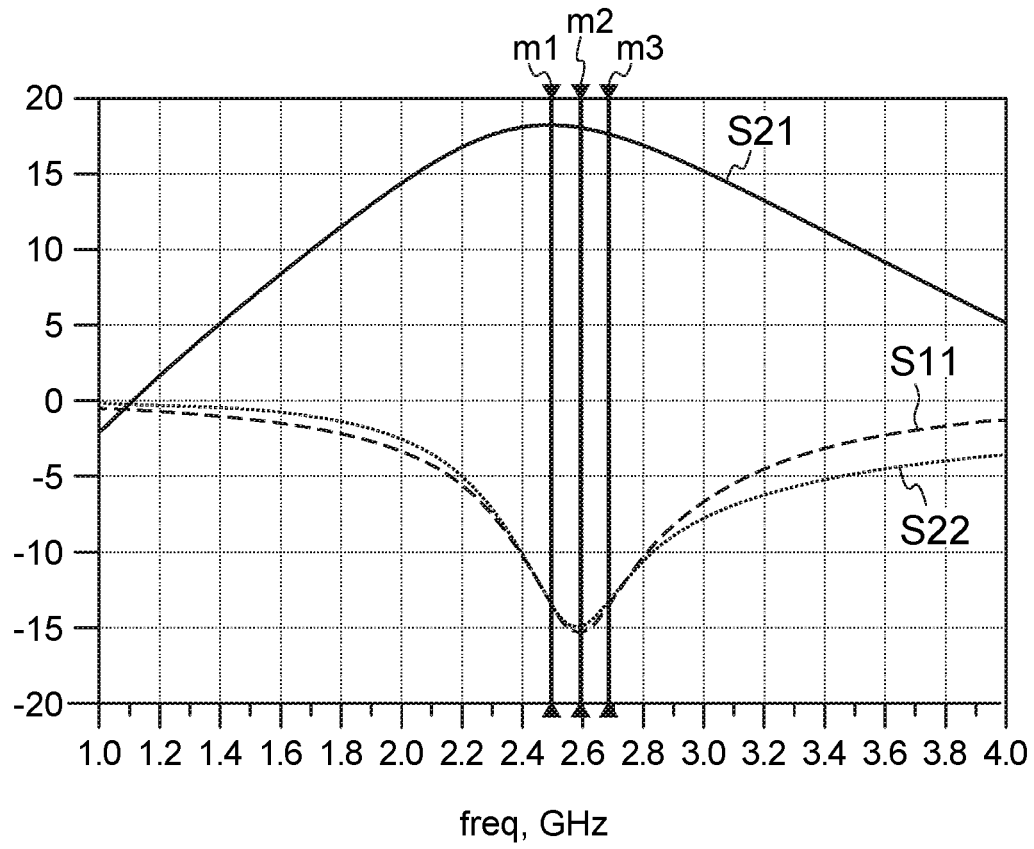
FIG. 3 is a chart illustrating an S parameter of the circuit in FIG. 2.

FIG. 3 is a chart illustrating Scattering Parameter (S parameter) being input/output characteristics in the case where a high-frequency input node RFin is a port 1 and an output port LNAout is a port 2 in the case of the aforementioned circuit constants. A solid line indicates S21, a broken line indicates S11, and a dotted line indicates S22. m1 illustrated in the chart indicates observation at a frequency of 2496 MHz, m2 indicates observation at a frequency of 2593 MHz, and m3 indicates observation at a frequency of 2690 MHz. The same applies to the explanation in the following embodiments.

The degree of amplification of the output signal to the input signal can be represented by S21. A larger S21 indicates a higher gain in a focused frequency band (for example, Band41: 2496 MHz to 2690 MHz). The degree of reflection (reflection property) on the port on the input side with respect to the input signal is represented by S11, and is desired to be low (for example, −10 dB or lower) because impedance match is required in principle at the input/output port in the high-frequency circuit. The same applies to S22 on the output side.

As illustrated in the chart, it is found that the curve of S21 takes a high value in a focused frequency range. On the other hand, curves of S11 and S22 take low values in the focused frequency range.

Numerical values indicated at the upper part in the chart represent numerical values of parameters at the respective observation points. The gain at the center of the range is excellent such as 18.06 dB, and both S11 and S22 in the range are −13 dB or lower and satisfy the general requirement (−12 dB or lower). In this embodiment, a bias current Idd_lna is 6.138 mA which is large by the bias current (171 uA) in the IIP3 compensation circuit (distortion compensation circuit) 10 as compared with the case where the IIP3 compensation circuit (distortion compensation circuit) 10 in FIG. 1 is not provided. Hereinafter, a circuit in which the IIP3 compensation circuit (distortion compensation circuit) 10 in FIG. 1 is not provided is described as a comparative example. The S parameter and Noise Figure (NF) according to this embodiment are substantially the same as the S parameter and noise characteristics in the comparative example.

Figure 4:
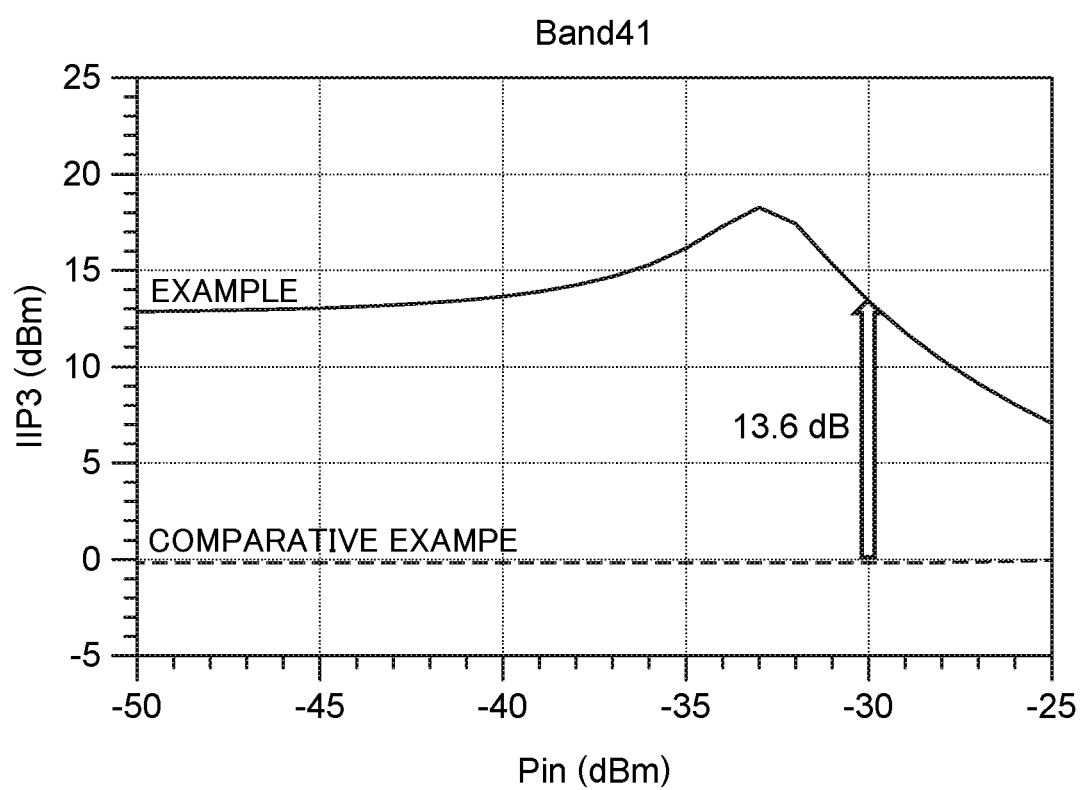
FIG. 4 is a chart illustrating an IIP3 of the circuit in FIG. 2.

FIG. 4 is a chart illustrating Pin dependence of the IIP3 according to this embodiment. The IIP3 when the power level of the input signal is −30 dBm is 13.4 dBm which is improved by 13.6 dB as compared with the comparative example.

As explained above, according to this embodiment, provision of the distortion compensation circuit enables realization of the LNA excellent in IIP3. The distortion compensation circuit includes the diode-connected transistors and the resistor which are connected in series, and the capacitors connecting the nodes between the transistors and between the transistor and the resistor to the node between the cascode-connected transistors constituting the amplifier circuit, thereby suppressing the three-dimensional distortion. The distortion compensation circuit according to this embodiment can be mounted on an SOI, and therefore can achieve downsizing and reduction in power consumption.

Second Embodiment

Figure 5:
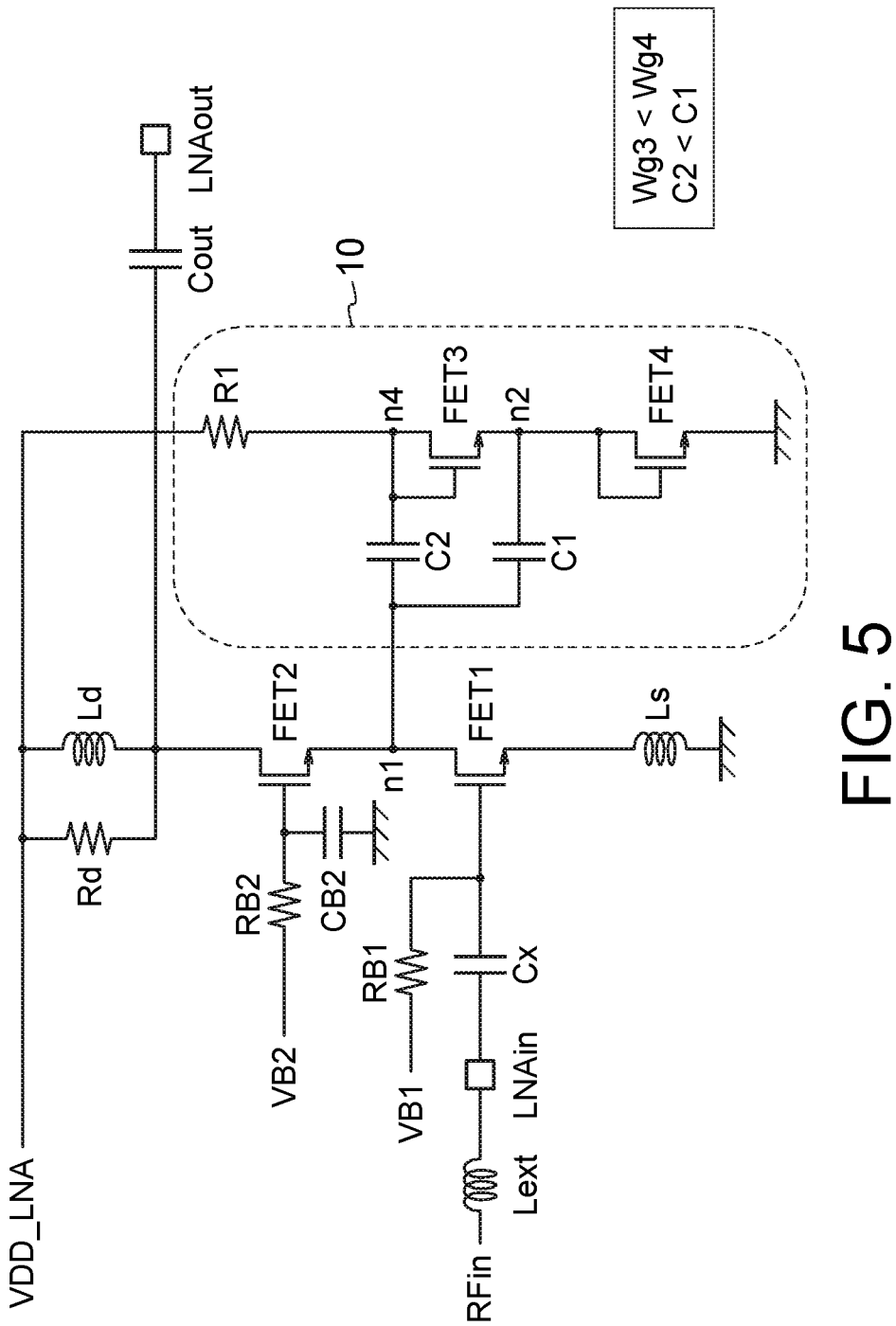
FIG. 5 is a diagram illustrating an LNA according to one embodiment.

FIG. 5 is a diagram illustrating an LNA1 according to a second embodiment. In the LNA1 according to this embodiment, an IIP3 compensation circuit 10 includes a first resistor R1, a third transistor FET3, and a fourth transistor FET4 which are connected in series between a power supply node VDD_LNA being an output of an internal voltage regulator and the ground point, and further includes a first capacitor C1 and a second capacitor C2.

The first resistor R1 has one terminal connected to the power supply node VDD_LNA. The third transistor FET3 has a drain and a gate connected to each other, and the drain and the gate are connected to another terminal of the first resistor R1. In other words, the third transistor FET3 has the drain and the gate connected to the power supply node VDD_LNA via the first resistor R1. The fourth transistor FET4 has a drain and a gate connected to each other, and the drain and the gate are connected to a source of the third transistor FET3, and the fourth transistor FET4 has a source which is grounded.

The capacitor C1 connects the first node n1 and the second node n2. The second capacitor C2 connects the first node n1 and a fourth node n4 between the drain of the third transistor FET3 and the first resistor R1.

In this embodiment, the gate widths of the third transistor FET3 and the fourth transistor FET4 satisfy Wg3<Wg4, and the electrostatic capacitances thereof satisfy C2<C1.

For example, regarding each transistor, the gate oxide film thickness is 2.5 nm, the gate length is 0.14 um, the threshold voltage is 0.37 V, Wg1 and Wg2 are 300 um, Wg3 is 5 um, Wg4 is 15 um, R1 is 4.7 kΩ, C1 is 0.32 pF, and C2 is 0.061 pF.

Figure 6:
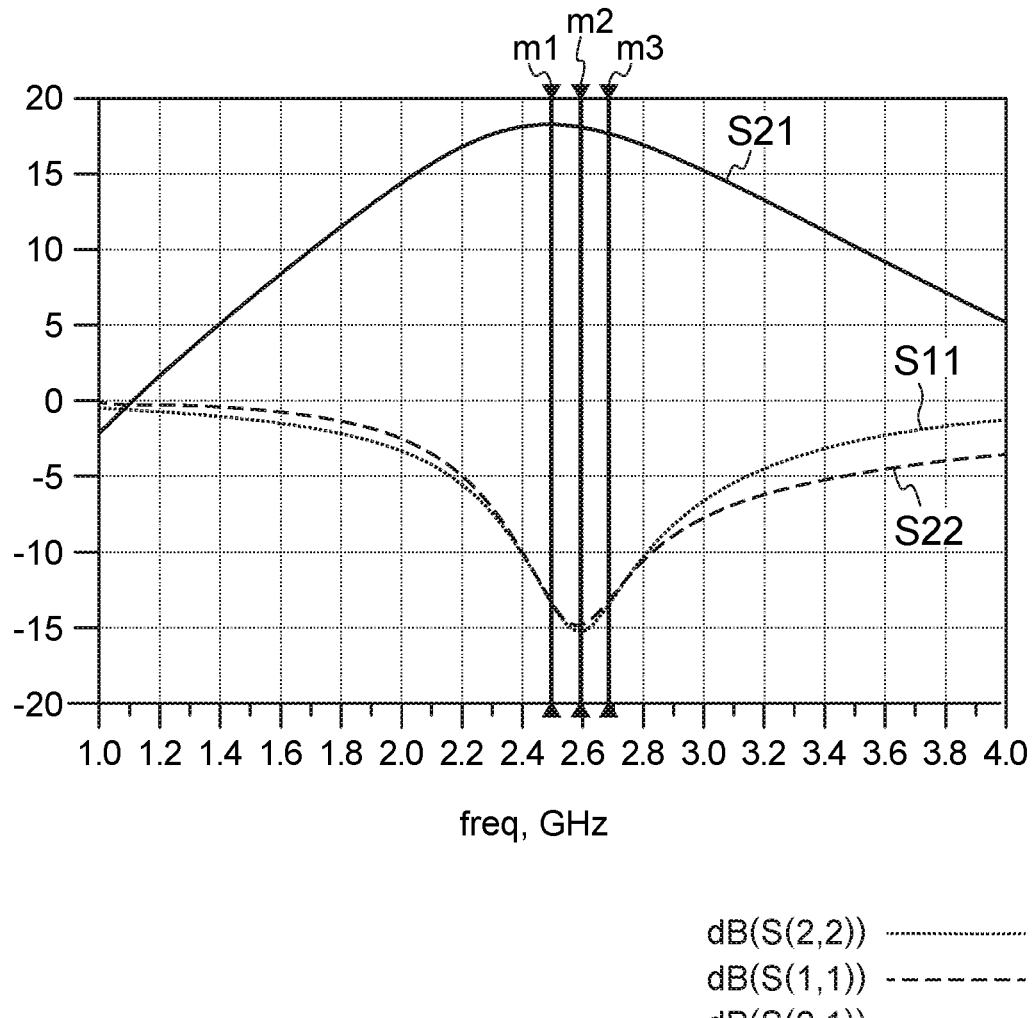
FIG. 6 is a chart illustrating an S parameter of the circuit in FIG. 5.

FIG. 6 is a chart illustrating S parameter being input/output characteristics at Band41 in the case of the aforementioned circuit constants.

As illustrated in the chart, it is found that the curve of S21 takes a high value in a focused frequency range. On the other hand, curves of S11 and S22 take low values in the focused frequency range.

The gain at the center of the range is excellent such as 18.1 dB, and both S11 and S22 in the range are −13 dB or lower and satisfy the general requirement. In this embodiment, a bias current Idd_Ilna is 6.12 mA which is large by the bias current (153 uA) in the IIP3 compensation circuit 10 as compared with the comparative example. The S parameter and NF according to this embodiment are substantially the same as the S parameter and NF in the comparative example.

Figure 7:
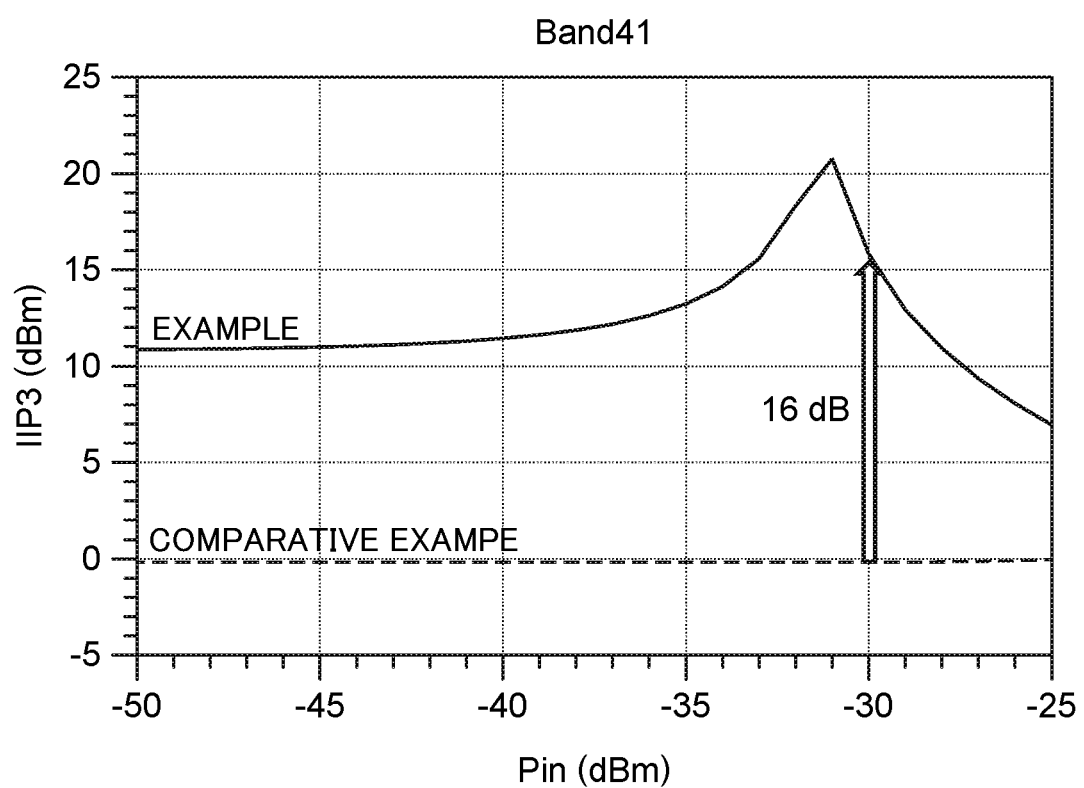
FIG. 7 is a chart illustrating an IIP3 of the circuit in FIG. 5.

FIG. 7 is a chart illustrating Pin dependence of the IIP3 according to this embodiment. The IIP3 when the power level of the input signal is −30 dBm is 15.8 dBm which is improved by 16.0 dB as compared with the comparative example.

As explained above, according to this embodiment, provision of the distortion compensation circuit enables realization of the LNA excellent in IIP3. The distortion compensation circuit according to this embodiment can be mounted on an SOI, and therefore can achieve downsizing and reduction in power consumption.

Third Embodiment

Figure 8:
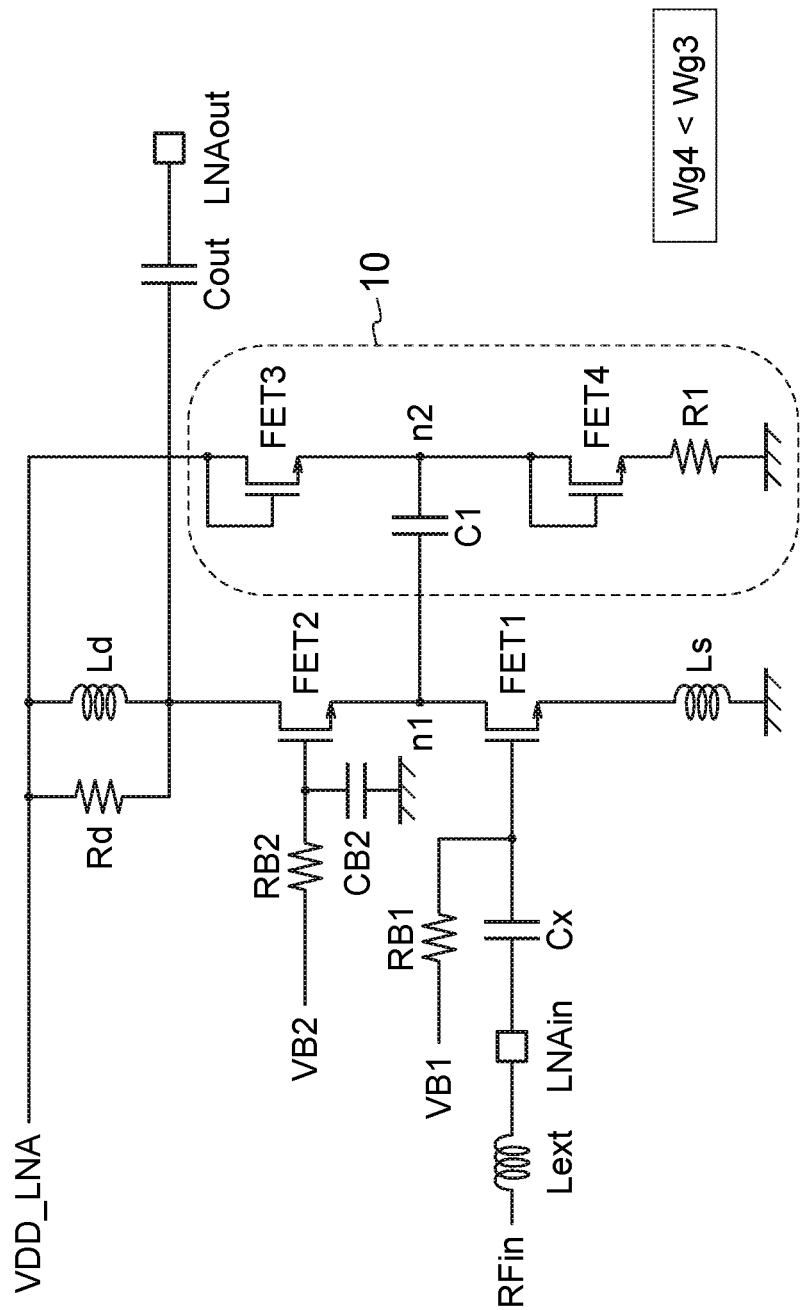
FIG. 8 is a diagram illustrating an LNA according to one embodiment.

FIG. 8 is a diagram illustrating an LNA1 according to a third embodiment. In the LNA1 according to this embodiment, an IIP3 compensation circuit 10 includes a third transistor FET3, a fourth transistor FET4, and a first resistor R1 which are connected in series between a power supply node VDD_LNA being an output of an internal voltage regulator and the ground point, and further includes a first capacitor C1.

The third transistor FET3 has a drain and a gate connected to each other, and the drain and the gate are connected to the power supply node VDD_LNA. The fourth transistor FET4 has a drain and a gate connected to each other, and the drain and the gate are connected to a source of the third transistor FET3. The first resistor R1 has one terminal connected to a source of the fourth transistor FET4, and has another terminal which is grounded. In other words, the fourth transistor FET4 has the source which is grounded via the first resistor R1.

The capacitor C1 connects the first node n1 and the second node n2.

In this embodiment, the gate widths of the third transistor FET3 and the fourth transistor FET4 satisfy Wg4<Wg3.

For example, regarding each transistor, the gate oxide film thickness is 2.5 nm, the gate length is 0.14 um, the threshold voltage is 0.37 V, Wg1 and Wg2 are 300 um, Wg3 is 15 um, Wg4 is 5 um, R1 is 6.2 kΩ, C1 is 0.34 pF.

Figure 9:
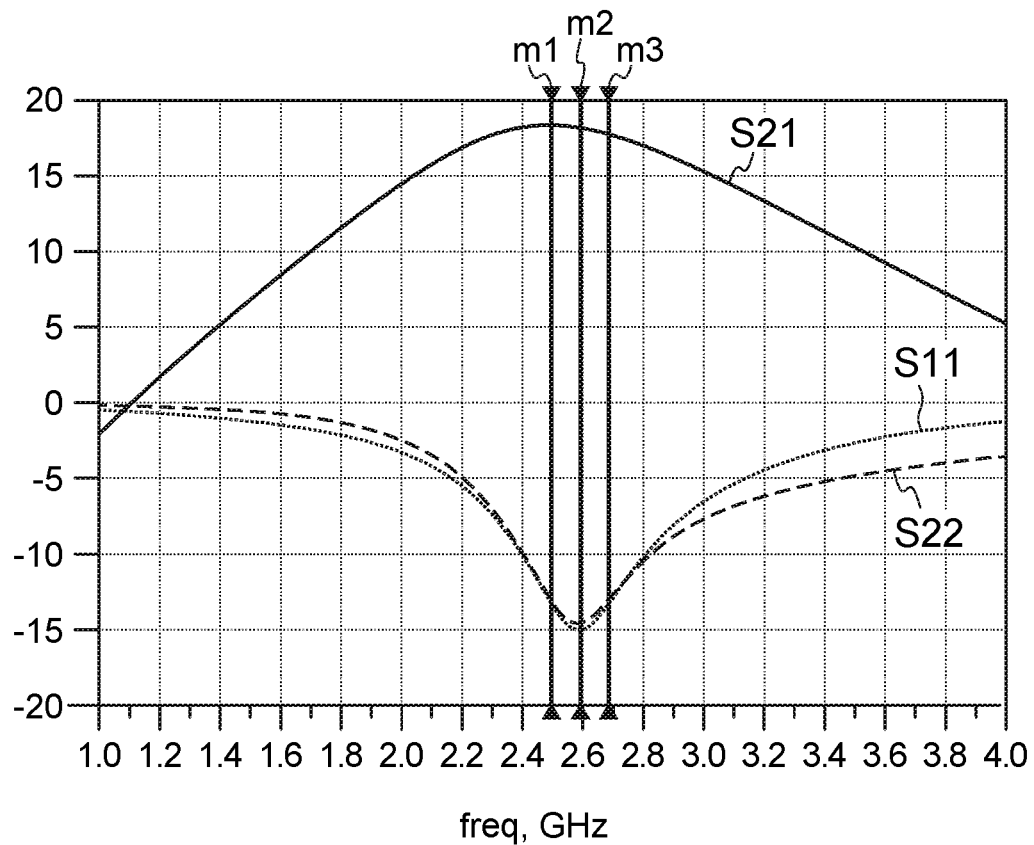
FIG. 9 is a chart illustrating an S parameter of the circuit in FIG. 8.

FIG. 9 is a chart illustrating S parameter being input/output characteristics at Band41 in the case of the aforementioned circuit constants.

As illustrated in the chart, it is found that the curve of S21 takes a high value in a focused frequency range. On the other hand, curves of S11 and S22 take low values in the focused frequency range.

The gain at the center of the range is excellent such as 18.2 dB, and both S11 and S22 in the range are −13 dB or lower and satisfy the general requirement. In this embodiment, a bias current Idd_Ina is 6.088 mA which is large by the bias current (121 uA) in the IIP3 compensation circuit 10 as compared with the comparative example. The S parameter and NF according to this embodiment are substantially the same as the S parameter and NF in the comparative example.

Figure 10:
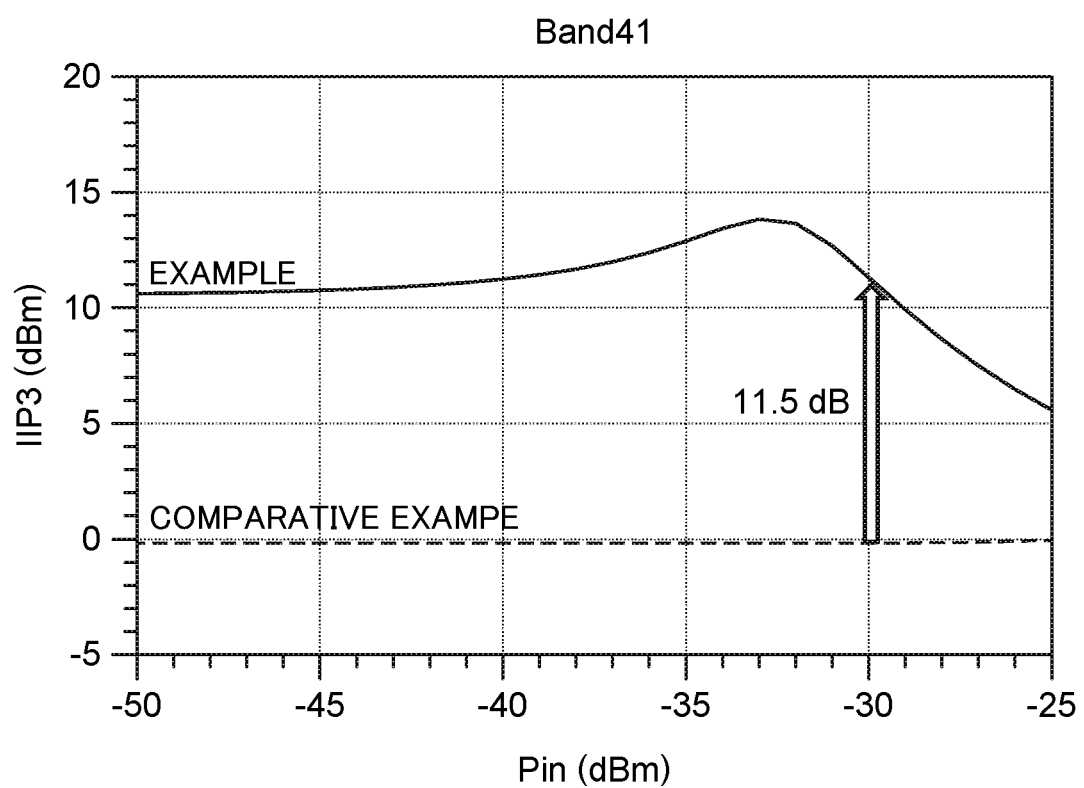
FIG. 10 is a chart illustrating an IIP3 of the circuit in FIG. 8.

FIG. 10 is a chart illustrating Pin dependence of the IIP3 according to this embodiment. The IIP3 when the power level of the input signal is −30 dBm is 11.3 dBm which is improved by 11.5 dB as compared with the comparative example.

As explained above, according to this embodiment, provision of the distortion compensation circuit enables realization of the LNA excellent in IIP3. The distortion compensation circuit according to this embodiment can be mounted on an SOI, and therefore can achieve downsizing and reduction in power consumption.

Note that even when the connection order of the fourth transistor FET4 and the first resistor R1 is reversed, the same characteristics can be obtained in this embodiment.

Forth Embodiment

Figure 11:
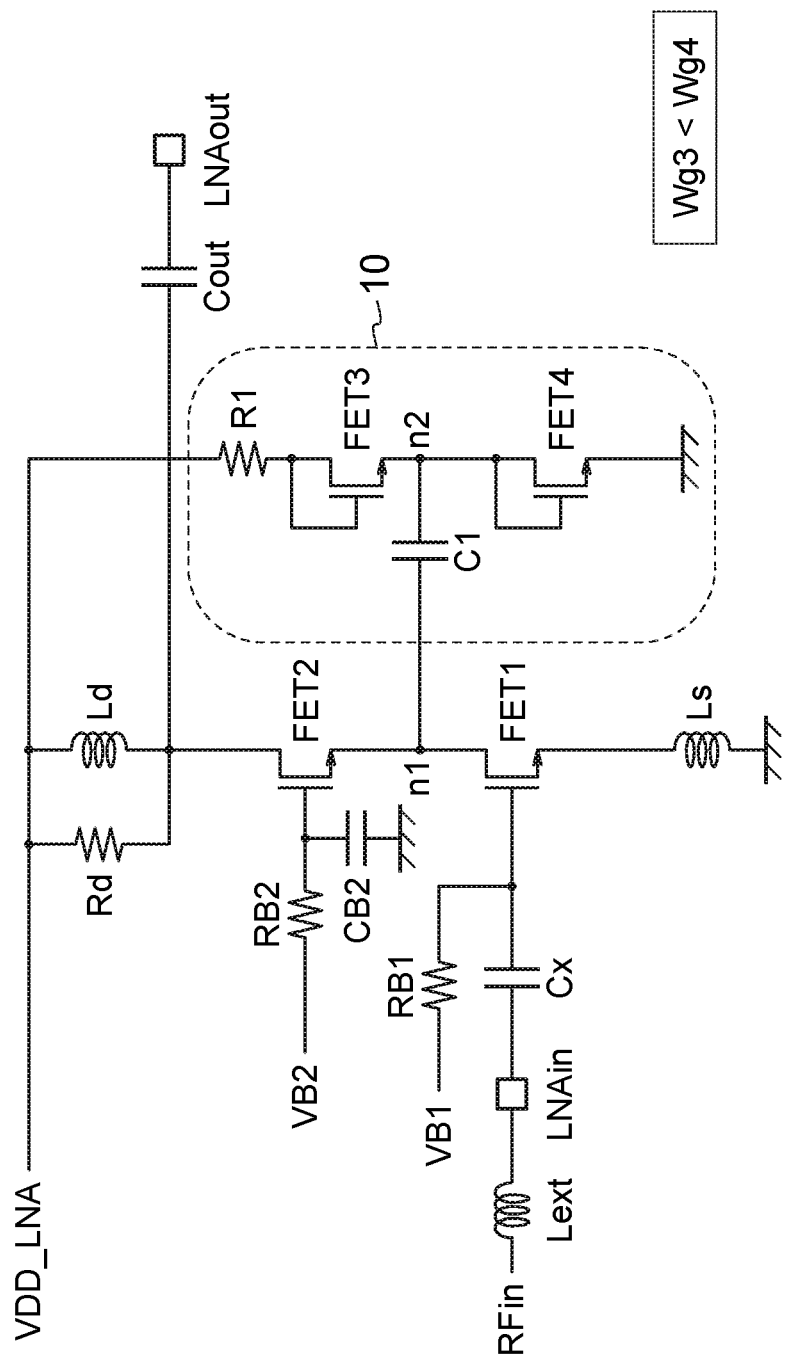
FIG. 11 is a diagram illustrating an LNA according to one embodiment.

FIG. 11 is a diagram illustrating an LNA1 according to a forth embodiment. In the LNA1 according to this embodiment, an IIP3 compensation circuit 10 includes a first resistor R1, a third transistor FET3, and a fourth transistor FET4 which are connected in series between a power supply node VDD_LNA being an output of an internal voltage regulator and the ground point, and further includes a first capacitor C1.

The first resistor R1 has one terminal connected to the power supply node VDD_LNA. The third transistor FET3 has a drain and a gate connected to each other, and the drain and the gate are connected to another terminal of the first resistor R1. In other words, the third transistor FET3 has the drain and the gate connected to the power supply node VDD_LNA via the first resistor R1. The fourth transistor FET4 has a drain and a gate connected to each other, and the drain and the gate are connected to a source of the third transistor FET3, and the fourth transistor FET4 has a source which is grounded.

The capacitor C1 connects the first node n1 and the second node n2.

In this embodiment, the gate widths of the third transistor FET3 and the fourth transistor FET4 satisfy Wg3<Wg4.

For example, regarding each transistor, the gate oxide film thickness is 2.5 nm, the gate length is 0.14 um, the threshold voltage is 0.37 V, Wg1 and Wg2 are 300 um, Wg3 is 5 um, Wg4 is 20 um, R1 is 6.0 kΩ, C1 is 0.32 pF.

Figure 12:
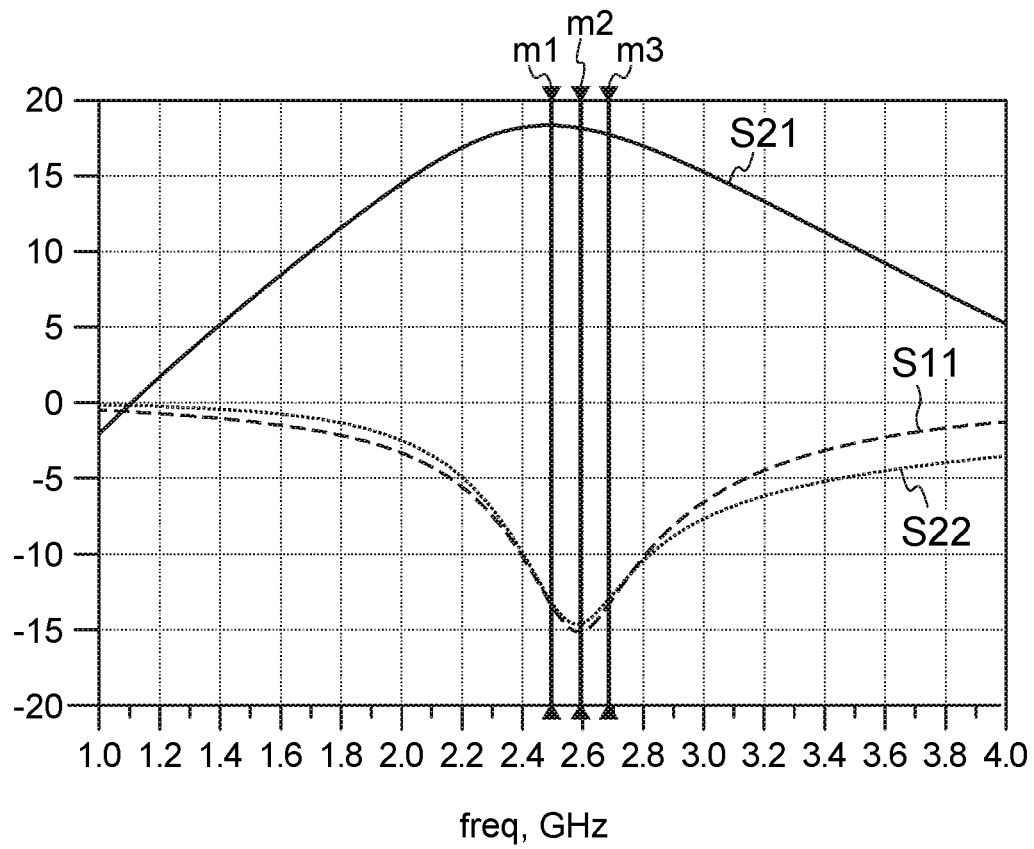
FIG. 12 is a chart illustrating an S parameter of the circuit in FIG. 11.

FIG. 12 is a chart illustrating S parameter being input/output characteristics at Band41 in the case of the aforementioned circuit constants.

As illustrated in the chart, it is found that the curve of S21 takes a high value in a focused frequency range. On the other hand, curves of S11 and S22 take low values in the focused frequency range.

The gain at the center of the range is excellent such as 18.2 dB, and both S11 and S22 in the range are −13 dB or lower and satisfy the general requirement. In this embodiment, a bias current Idd_Ina is 6.094 mA which is large by the bias current (127 uA) in the IIP3 compensation circuit 10 as compared with the comparative example. The S parameter and NF according to this embodiment are substantially the same as the S parameter and NF in the comparative example.

Figure 13:
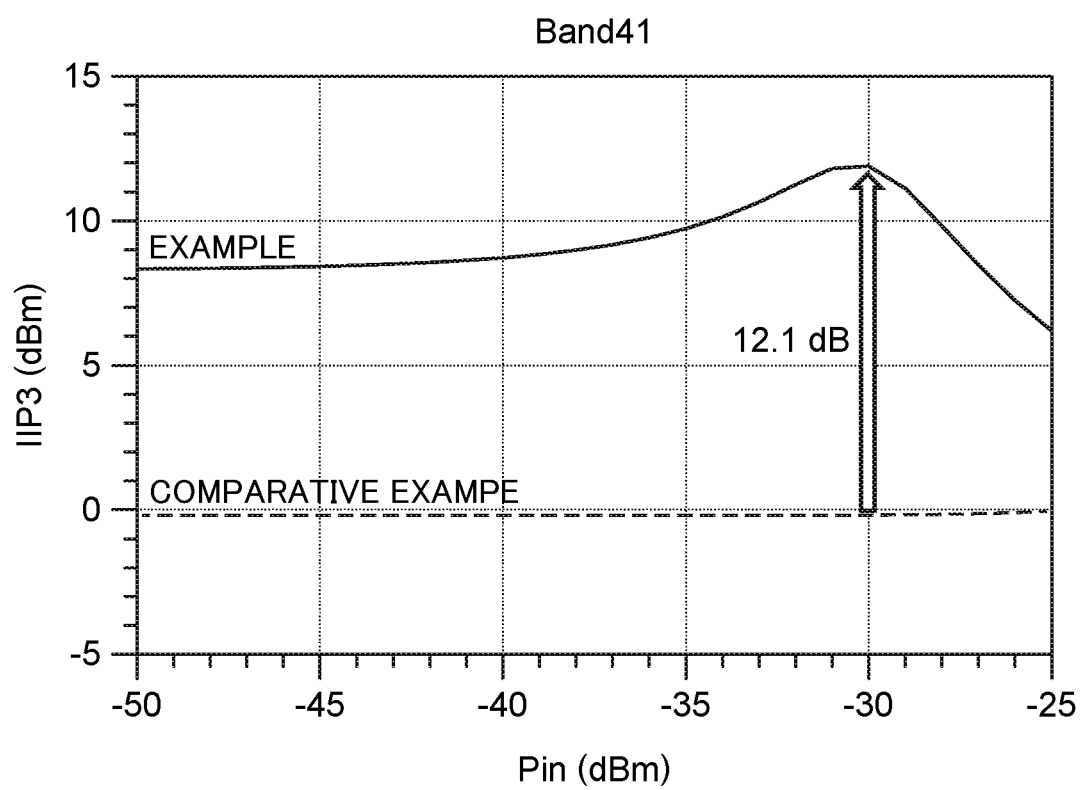
FIG. 13 is a chart illustrating an IIP3 of the circuit in FIG. 11.

FIG. 13 is a chart illustrating Pin dependence of the IIP3 according to this embodiment. The IIP3 when the power level of the input signal is −30 dBm is 11.9 dBm which is improved by 12.1 dB as compared with the comparative example.

As explained above, according to this embodiment, provision of the distortion compensation circuit enables realization of the LNA excellent in IIP3. The distortion compensation circuit according to this embodiment can be mounted on an SOI, and therefore can achieve downsizing and reduction in power consumption.

Note that even when the connection order of the third transistor FET3 and the first resistor R1 is reversed, the same characteristics can be obtained in this embodiment.

Fifth Embodiment

Figure 14:
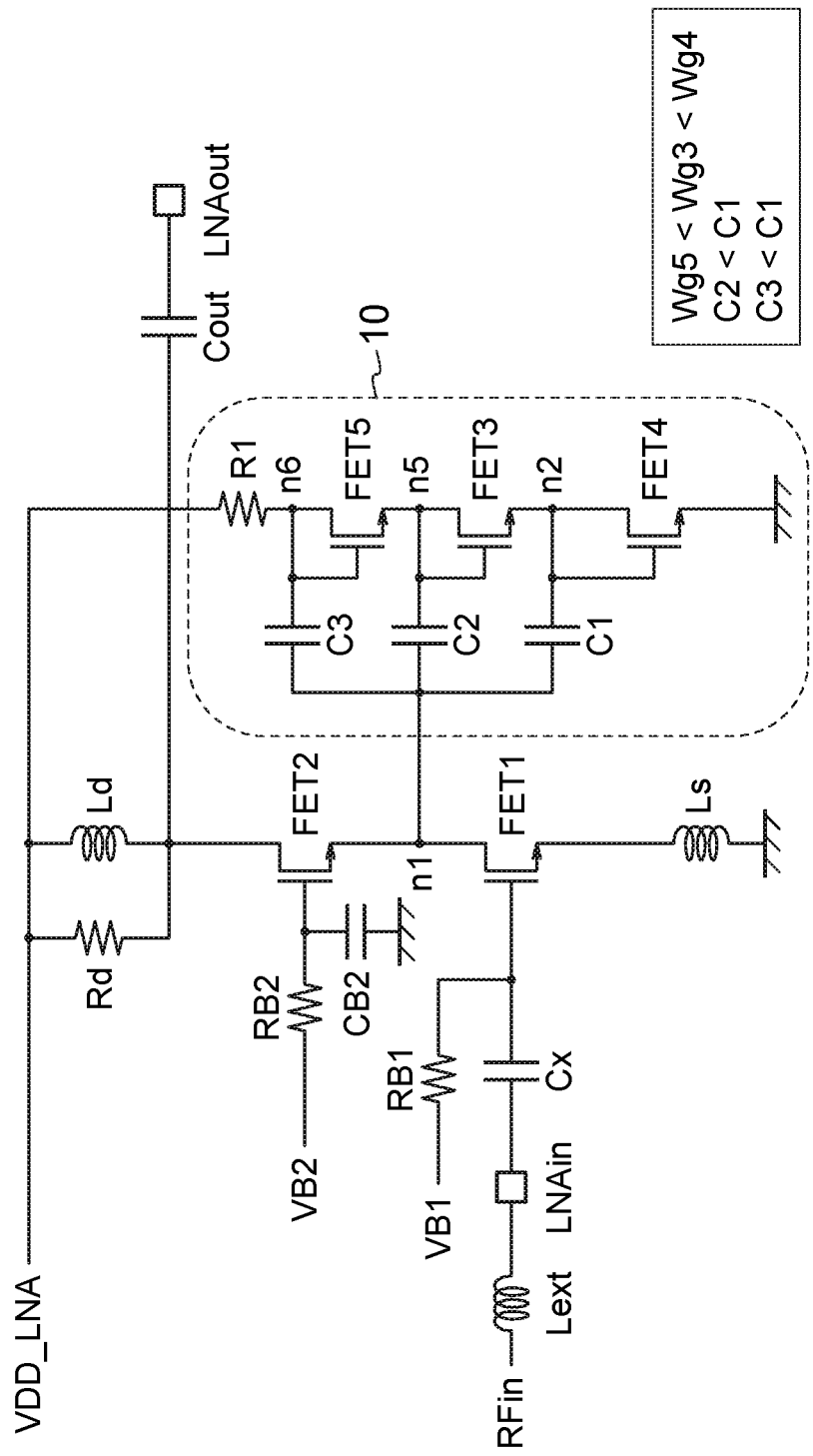
FIG. 14 is a diagram illustrating an LNA according to one embodiment.

FIG. 14 is a diagram illustrating an LNA1 according to a fifth embodiment. In the LNA1 according to this embodiment, an IIP3 compensation circuit 10 includes a first resistor R1, a fifth transistor FET5, a third transistor FET3, and a fourth transistor FET4 which are connected in series between a power supply node VDD_LNA being an output of an internal voltage regulator and the ground point, and further includes a first capacitor C1, a second capacitor C2, and a third capacitor C3.

The first resistor R1 has one terminal connected to the power supply node VDD_LNA. The fifth transistor FET5 has a drain and a gate connected to each other, and the drain and the gate are connected to another terminal of the first resistor R1. In other words, the fifth transistor FET5 has the drain and the gate connected to the power supply node VDD_LNA via the first resistor R1. The third transistor FET3 has a drain and a gate connected to each other, and the drain and the gate are connected to a source of the fifth transistor FET5. The fourth transistor FET4 has a drain and a gate connected to each other, and the drain and the gate are connected to a source of the third transistor FET3, and the fourth transistor FET4 has a source which is grounded.

The capacitor C1 connects the first node n1 and the second node n2. The second capacitor C2 connects the first node n1 and a fifth node n5 between the drain of the third transistor FET3 and the source of the fifth transistor FET5. The third capacitor C3 connects the first node n1 and a sixth node n6 between the first resistor R1 and the drain of the fifth transistor FET5.

In this embodiment, the gate widths of the third transistor FET3, the fourth transistor FET4, and the fifth transistor FET5 satisfy Wg5<Wg3<Wg4, and the electrostatic capacitances thereof satisfy C2<C1 and C3<C1.

For example, regarding each transistor, the gate oxide film thickness is 2.5 nm, the gate length is 0.14 um, the threshold voltage is 0.37 V, Wg1 and Wg2 are 300 um, Wg3 is 10 um, Wg4 is 15 um, Wg 5 is 5 um, R1 is 1.21 kΩ, C1 is 0.462 pF, C2 is 26.8 fF, and C3 is 42.1 fF.

Figure 15:
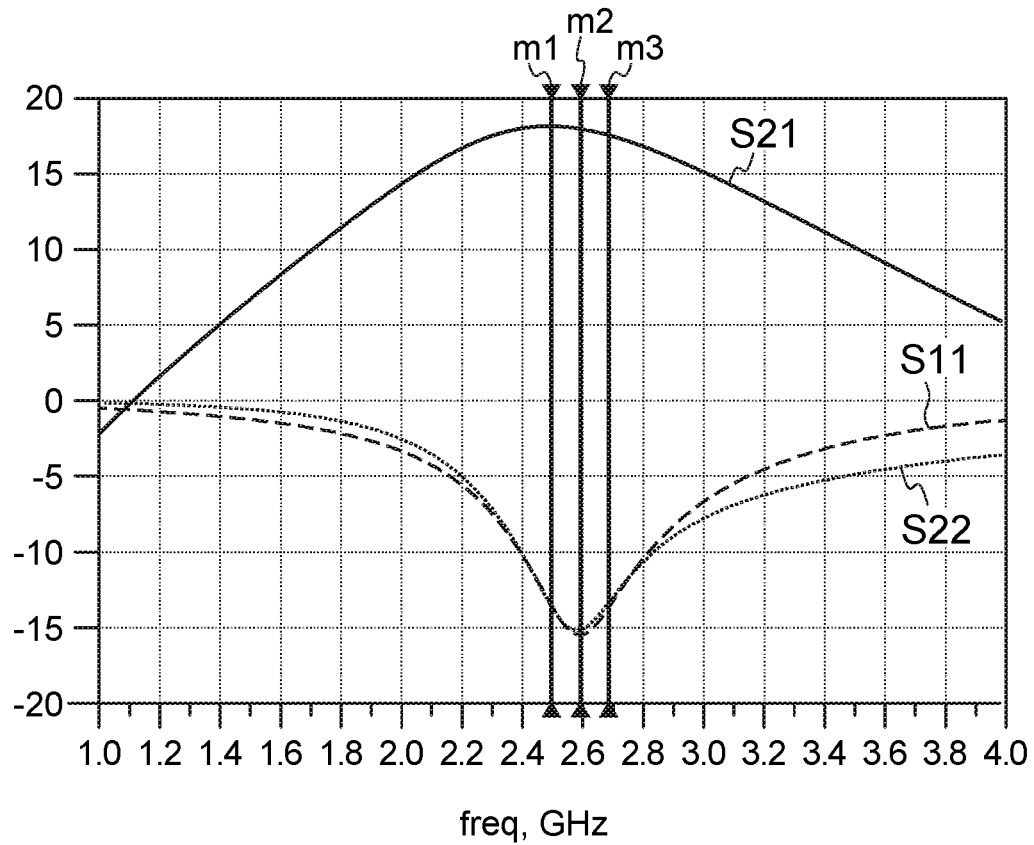
FIG. 15 is a chart illustrating an S parameter of the circuit in FIG. 14.

FIG. 15 is a chart illustrating S parameter being input/output characteristics at Band41 in the case of the aforementioned circuit constants.

As illustrated in the chart, it is found that the curve of S21 takes a high value in a focused frequency range. On the other hand, curves of S11 and S22 take low values in the focused frequency range.

The gain at the center of the range is excellent such as 18.0 dB, and both S11 and S22 in the range are −13 dB or lower and satisfy the general requirement. In this embodiment, a bias current Idd_Ina is 6.12 mA which is large by the bias current (155 uA) in the IIP3 compensation circuit 10 as compared with the comparative example. The S parameter and NF according to this embodiment are substantially the same as the S parameter and NF in the comparative example.

Figure 16:
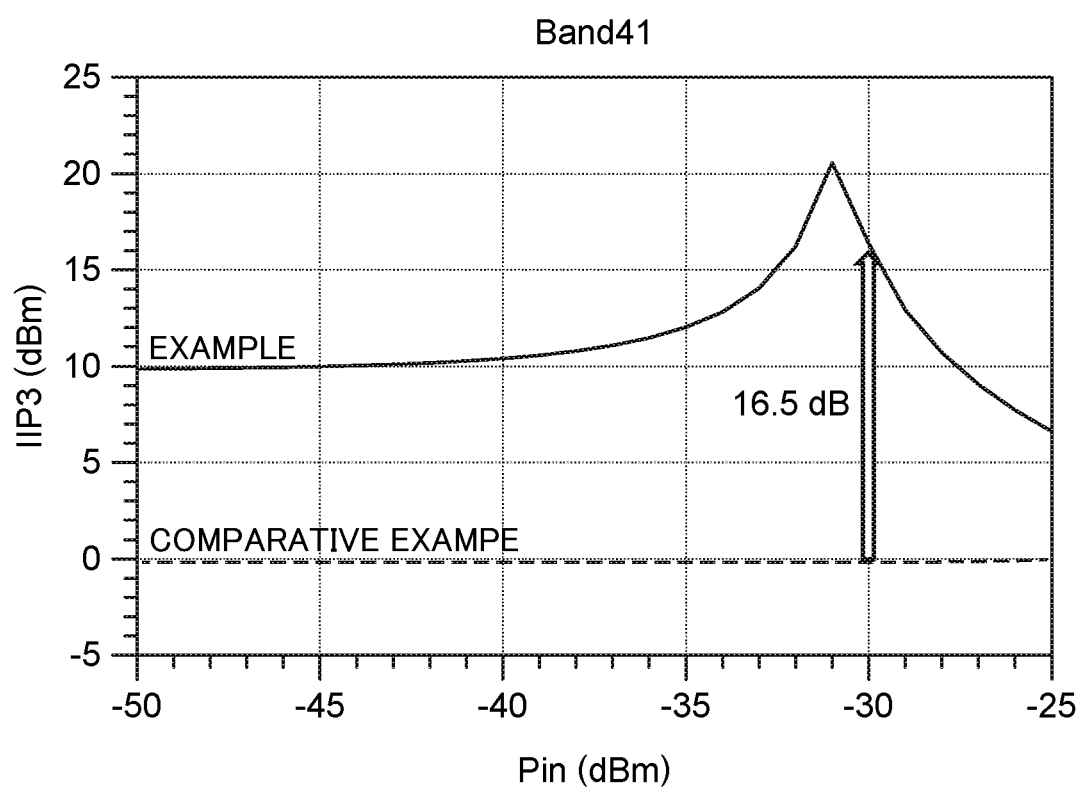
FIG. 16 is a chart illustrating an IIP3 of the circuit in FIG. 14.

FIG. 16 is a chart illustrating Pin dependence of the IIP3 according to this embodiment. The IIP3 when the power level of the input signal is −30 dBm is 16.3 dBm which is improved by 16.5 dB as compared with the comparative example.

As explained above, according to this embodiment, provision of the distortion compensation circuit enables realization of the LNA excellent in IIP3. The distortion compensation circuit according to this embodiment can be mounted on an SOI, and therefore can achieve downsizing and reduction in power consumption.

Sixth Embodiment

Figure 17:
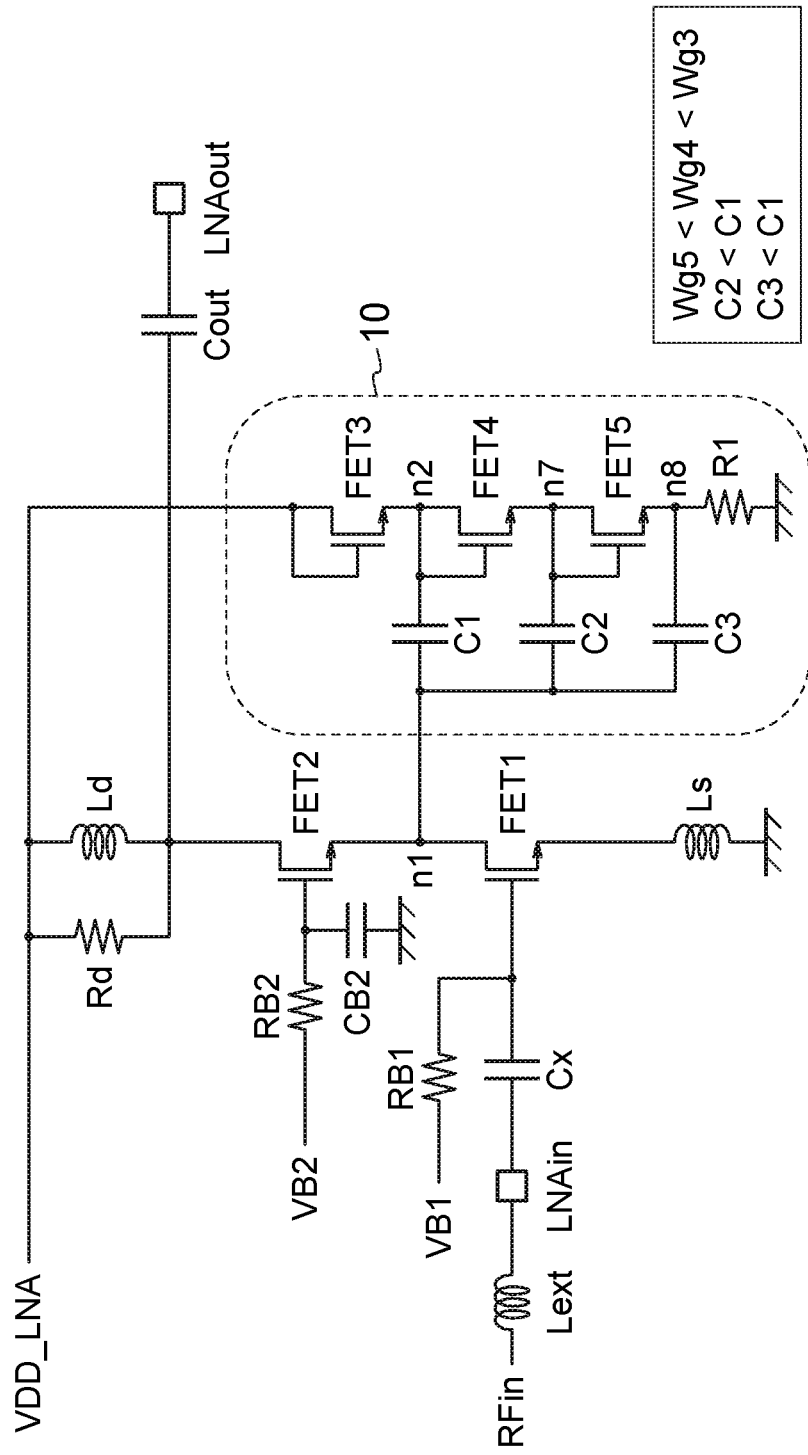
FIG. 17 is a diagram illustrating an LNA according to one embodiment.

FIG. 17 is a diagram illustrating an LNA1 according to a sixth embodiment. In the LNA1 according to this embodiment, an IIP3 compensation circuit 10 includes a third transistor FET3, and a fourth transistor FET4, and a fifth transistor FET5, and a first resistor R1 which are connected in series between a power supply node VDD_LNA being an output of an internal voltage regulator and the ground point, and further includes a first capacitor C1, a second capacitor C2, and a third capacitor C3.

The third transistor FET3 has a drain and a gate connected to each other, and the drain and the gate are connected to the power supply node VDD_LNA. The fourth transistor FET4 has a drain and a gate connected to each other, and the drain and the gate are connected to a source of the third transistor FET3. The fifth transistor FET5 has a drain and gate connected to each other, and the drain and the gate connected to a source of the fourth transistor FET4. The first capacitor R1 has one terminal connected to a source of the fifth transistor FET5, and another terminal which is grounded. In other words, the fifth transistor FET5 has the source which is grounded via the first transistor R1.

The capacitor C1 connects the first node n1 and the second node n2. The second capacitor C2 connects the first node n1 and a seventh node n7 between the source of the fourth transistor FET4 and the drain of the fifth transistor FET5. The third capacitor C3 connects the first node n1 and a eighth node n8 between the first resistor R1 and the source of the fifth transistor FET5.

In this embodiment, the gate widths of the third transistor FET3, the fourth transistor FET4, and the fifth transistor FET5 satisfy Wg5<Wg4<Wg3, and the electrostatic capacitances thereof satisfy C2<C1 and C3<C1.

For example, regarding each transistor, the gate oxide film thickness is 2.5 nm, the gate length is 0.14 um, the threshold voltage is 0.37 V, Wg1 and Wg2 are 300 um, Wg3 is 15 um, Wg4 is 10 um, Wg5 is 5 um, R1 is 1.22 kΩ, C1 is 0.394 pF, C2 is 34.7 fF, and C3 is 45.7 fF.

Figure 18:
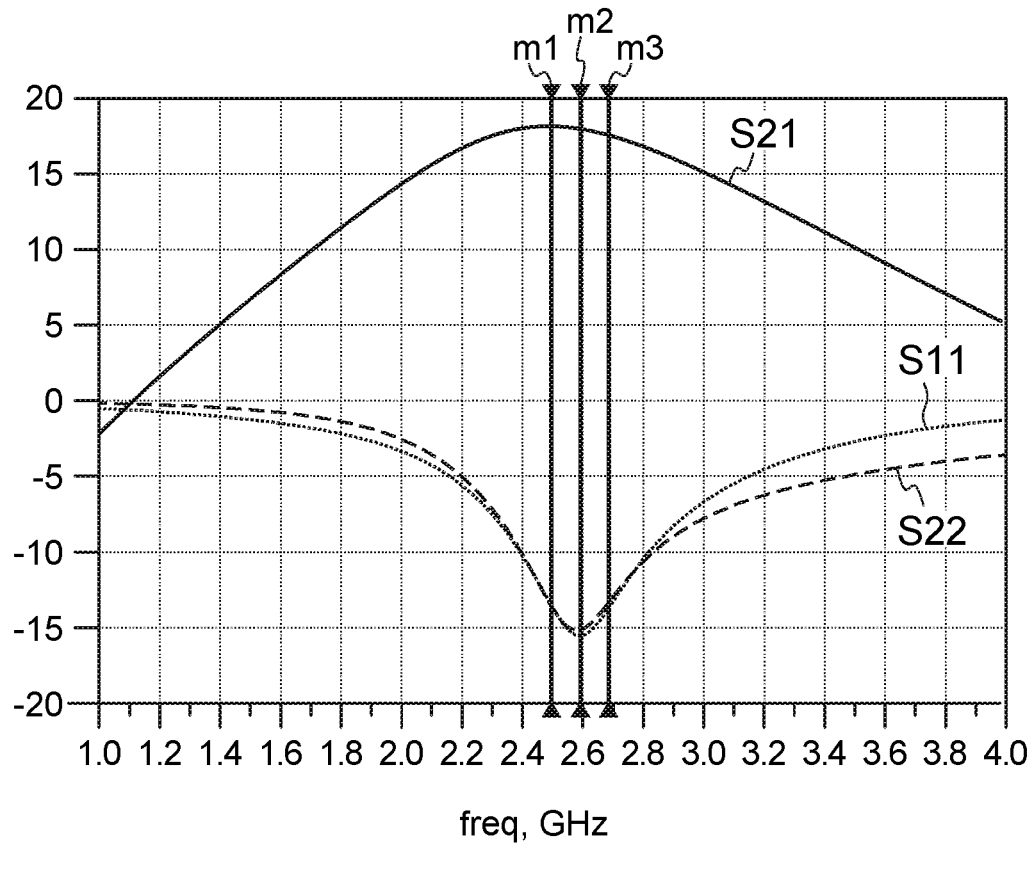
FIG. 18 is a chart illustrating an S parameter of the circuit in FIG. 17.

FIG. 18 is a chart illustrating S parameter being input/output characteristics at Band41 in the case of the aforementioned circuit constants.

As illustrated in the chart, it is found that the curve of S21 takes a high value in a focused frequency range. On the other hand, curves of S11 and S22 take low values in the focused frequency range.

The gain at the center of the range is excellent such as 18.0 dB, and both S11 and S22 in the range are −13 dB or lower and satisfy the general requirement. In this embodiment, a bias current Idd_Ina is 6.12 mA which is large by the bias current (155 uA) in the IIP3 compensation circuit 10 as compared with the comparative example. The S parameter and NF according to this embodiment are substantially the same as the S parameter and NF in the comparative example.

Figure 19:
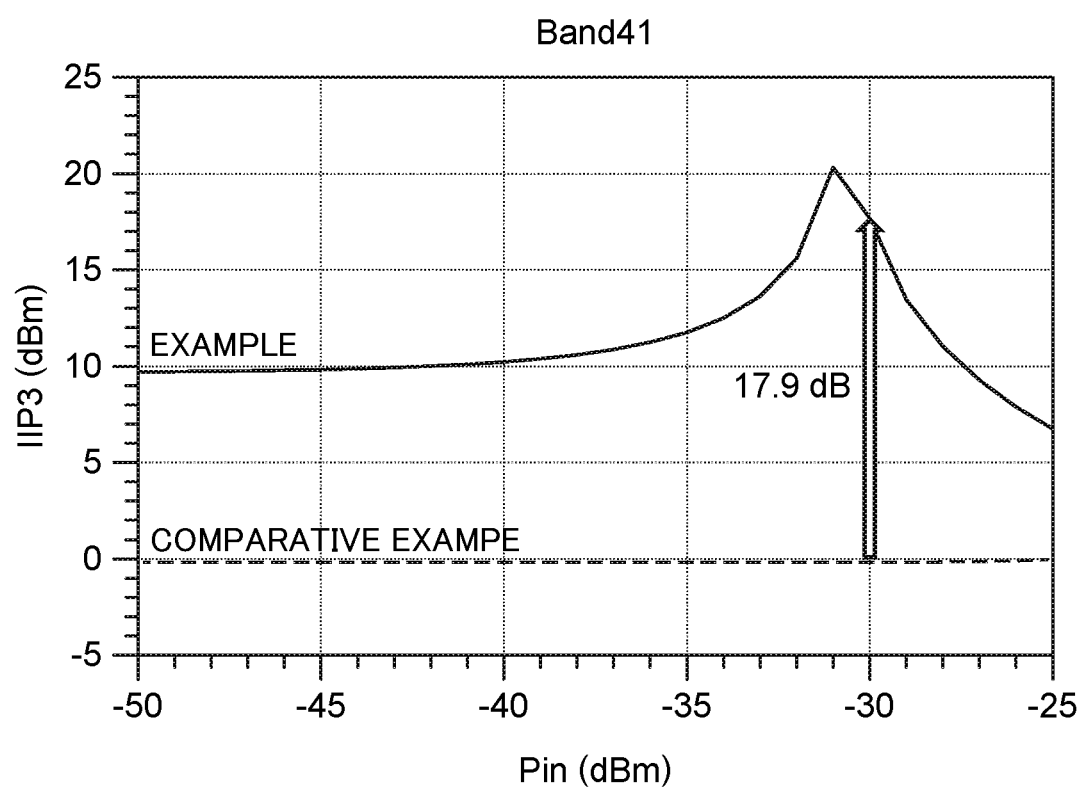
FIG. 19 is a chart illustrating an IIP3 of the circuit in FIG. 17.

FIG. 19 is a chart illustrating Pin dependence of the IIP3 according to this embodiment. The IIP3 when the power level of the input signal is −30 dBm is 17.7 dBm which is improved by 17.9 dB as compared with the comparative example.

As explained above, according to this embodiment, provision of the distortion compensation circuit enables realization of the LNA excellent in IIP3. The distortion compensation circuit according to this embodiment can be mounted on an SOI, and therefore can achieve downsizing and reduction in power consumption.

As explained above, for the LNA1 according to the first embodiment to the sixth embodiment, as a common configuration of the IIP3 compensation circuit (distortion compensation circuit) 10, an excellent IIP3 is realized by making the gate width smaller in a transistor closer to a position where the first resistor R1 is connected. Similarly, when a plurality of capacitors exist, a capacitor to which the largest number of transistors are connected in series between the capacitor and the first resistor R1 has a larger electrostatic capacitance than those of other capacitors, on the opposite side to the first node.

Seventh Embodiment

Figure 20:
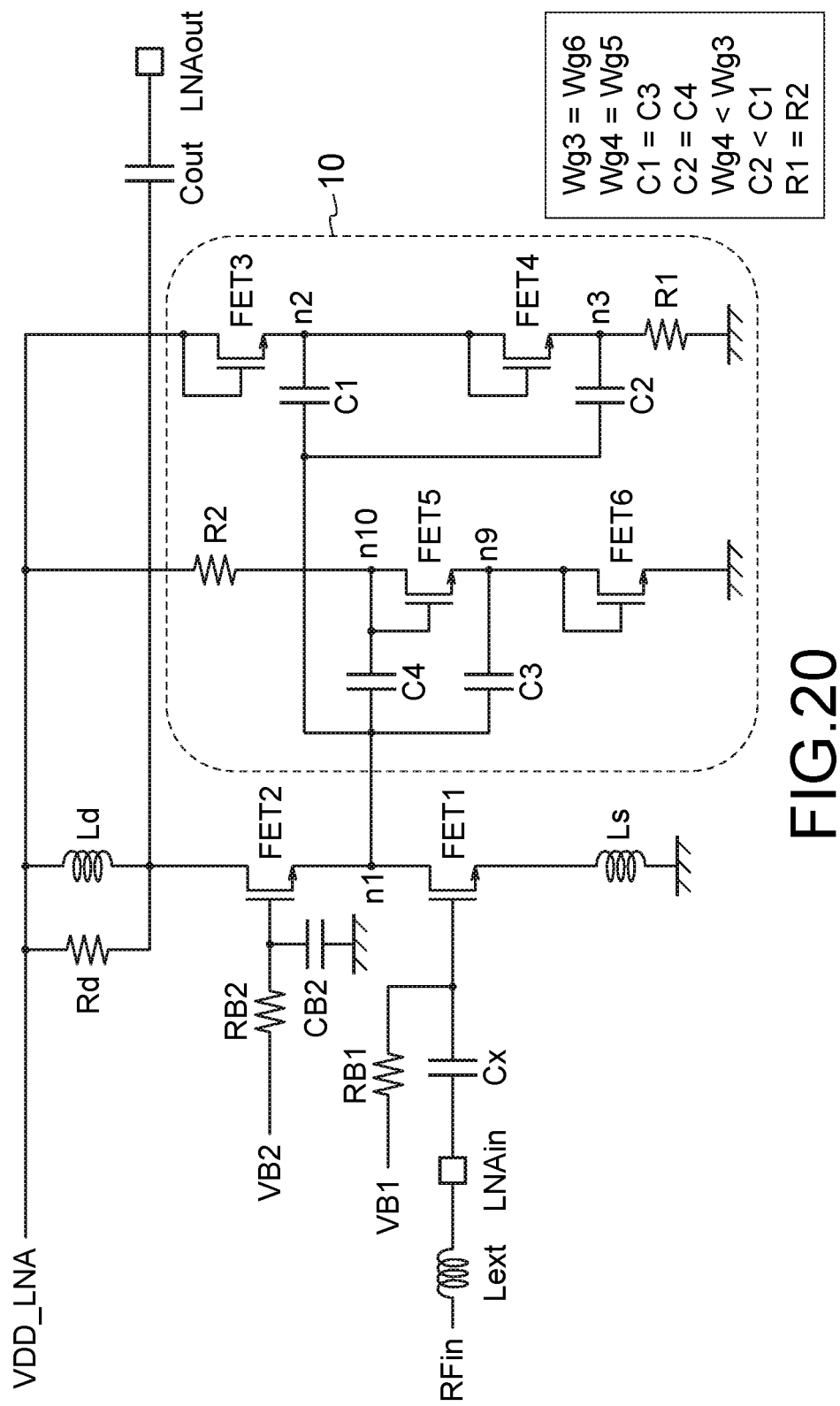
FIG. 20 is a diagram illustrating an LNA according to one embodiment.

FIG. 20 is a diagram illustrating an LNA1 according to a seventh embodiment. The IIP3 compensation circuit (distortion compensation circuit) 10 includes the transistors connected in series in each of the above-explained embodiments, and further includes transistors in parallel with the aforementioned transistors in this embodiment.

More specifically, in the LNA1 according to this embodiment, the IIP3 compensation circuit (distortion compensation circuit) 10 includes a third transistor FET3, a fourth transistor FET4, a first resistor R1, a first capacitor C1, and a second capacitor C2 which are connected in series between a power supply node VDD_LNA an output of an internal voltage regulator and the ground point, and further includes, in parallel with the above circuit, a second resistor R2, a fifth transistor FET5, a sixth transistor FET6, a third capacitor C3, and a fourth capacitor C4 which are connected in series between the power supply node VDD_LNA and the ground point.

The connection of the third transistor FET3, the fourth transistor FET4, the first resistor R1, the first capacitor C1, and the second capacitor C2 is the same as that in the first embodiment.

The second resistor R2 has one terminal connected to the power supply node VDD_LNA. The fifth transistor FET5 has a drain and a gate connected to each other, and the drain and the gate connected to another terminal of the second resistor R2. In other words, the fifth transistor FET5 has the drain and the gate connected the power supply node VDD_LNA via the second resistor R2. The sixth transistor FET6 has a drain and a gate connected to each other, and the drain and the gate connected to a source of the fifth transistor FET5, and the sixth transistor FET6 has a source which is grounded.

The third capacitor C3 connects the first node n1 and a ninth node n9 between the source of the fifth transistor FET5 and the drain of the sixth transistor FET6. The fourth capacitor C4 connects the first node n1 and a tenth node n10 between the drain of the fifth transistor FET5 and the second resistor R2.

In this embodiment, the gate widths of the third transistor FET3, the fourth transistor FET4, the fifth transistor FET5, and the sixth transistor FET6 satisfy Wg4<Wg3, Wg3=Wg6, and Wg4=Wg5, the electrostatic capacitances thereof satisfy C2<C1, C1=C3, and C2=C4, and the resistor thereof satisfy R1=R2.

For example, regarding each transistor, the gate oxide film thickness is 2.5 nm, the gate length is 0.14 um, the threshold voltage is 0.37 V, Wg1 and Wg2 are 300 um, Wg3 and Wg6 are 7.5 um, Wg4 and Wg5 are 2.5 um, R1 and R2 are 8.8 kΩ, C1 and C3 are 0.180 pF, and C2 and C4 are 0.030 pF.

Figure 21:
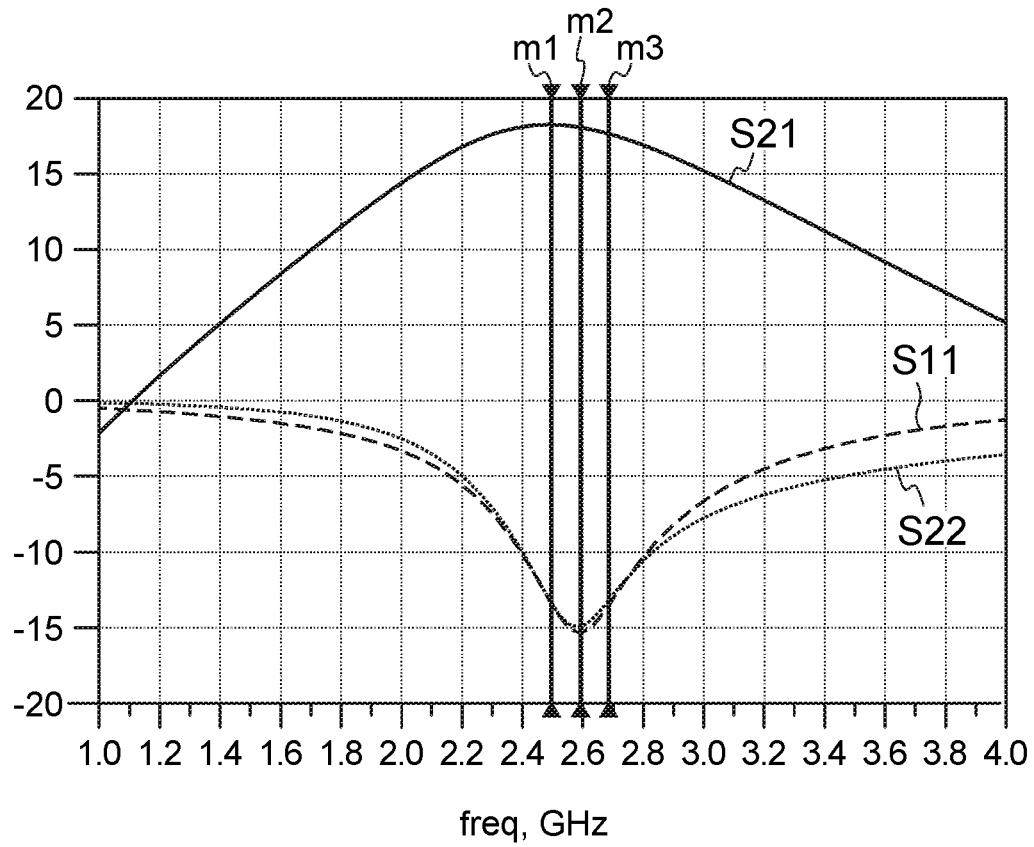
FIG. 21 is a chart illustrating an S parameter of the circuit in FIG. 20.

FIG. 21 is a chart illustrating S parameter being input/output characteristics at Band41 in the case of the aforementioned circuit constants.

As illustrated in the chart, it is found that the curve of S21 takes a high value in a focused frequency range. On the other hand, curves of S11 and S22 take low values in the focused frequency range.

The gain at the center of the range is excellent such as 18.1 dB, and both S11 and S22 in the range are −13 dB or lower and satisfy the general requirement. In this embodiment, a bias current Idd_Ina is 6.128 nnA which is large by the bias current (161 uA) in the IIP3 compensation circuit 10 as compared with the comparative example. The S parameter and NF according to this embodiment are substantially the same as the S parameter and NF in the comparative example.

Figure 22:
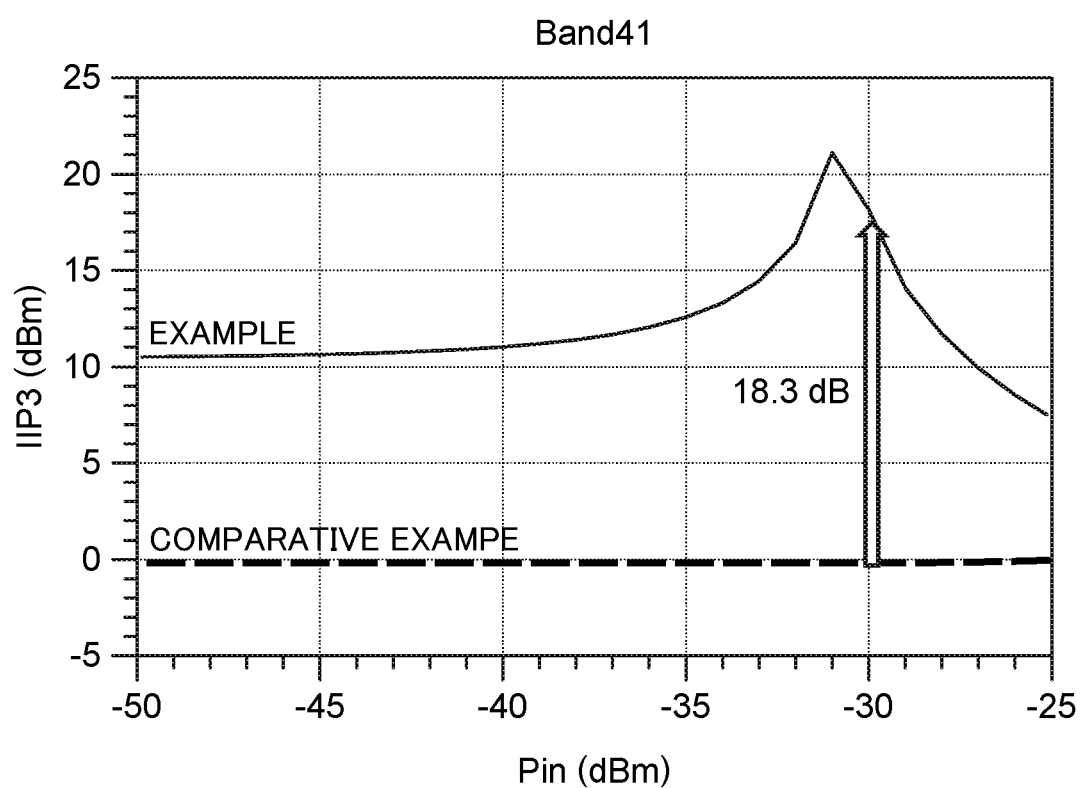
FIG. 22 is a chart illustrating an IIP3 of the circuit in FIG. 20.

FIG. 22 is a chart illustrating Pin dependence of the IIP3 according to this embodiment. The IIP3 when the power level of the input signal is −30 dBnn is 18.1 dBnn which is improved by 18.3 dB as compared with the comparative example.

As explained above, according to this embodiment, provision of the distortion compensation circuit enables realization of the LNA excellent in IIP3. The distortion compensation circuit according to this embodiment can be mounted on an SOI, and therefore can achieve downsizing and reduction in power consumption.

Note that the transistors for signal amplification in the amplifier circuit are configured at two stages in all of the above-explained embodiments, but may be configured at three stages. For example, the LNA1 may include a transistor having a gate grounded similarly in a high-frequency manner between the second transistor and the output port LNAout (and the output matching circuit) in addition to the first transistor FET1 and the second transistor FET2. In this case, the IIP3 compensation circuit 10 is desirably connected not to the source but to the drain of the FET2.

In each of the above-explained embodiments, having the same circuit constant means that the circuit constant does have to be strictly the same and, for example, only needs to be the same in a range where an individual difference or the like may arise even in elements having the same circuit constant.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in all of the above-explained embodiments, the n-type MOSFET may be a p-type MOSFET according to the situation and the p-type MOSFET may be an n-type MOSFET according to the situation. Further, as the MOSFET, another transistor having the same function, for example, the one which functions as a switching element by voltage, current, or another external switching signal, such as a bipolar transistor may be used. For example, in the case of using the bipolar transistor, the gate, source, drain in the explanation in this specification and claims may be replaced in reading with an appropriate combination of a base, a collector (emitter), and an emitter (collector), respectively. In any replacement in reading, the physical amount used for switching such as the magnitude of the voltage to be applied to the gate, the current to be applied to the base or the like can be appropriately replaced in reading so as to appropriately perform the equivalent operation as the one having the above-described functions by the characteristics of the elements.

The invention claimed is:

1. A high-frequency amplifier circuitry, comprising:
    an amplifier circuit, the amplifier circuit comprising:
        a first transistor having a gate to which an input signal is applied;
        an inductor having one terminal which is connected to a source of the first transistor and another terminal which is grounded; and
        a second transistor having a source which is connected to a drain of the first transistor, a gate which is grounded, and a drain which is connected to a power supply voltage terminal, the second transistor configured to output from the drain a signal obtained by amplifying the input signal; and
    a distortion compensation circuit, the distortion compensation circuit comprising:
        a third transistor having a drain and a gate which are connected to each other, the third transistor connected to the power supply voltage terminal on the drain side;
        a fourth transistor having a drain and a gate which are connected to a source of the third transistor, the fourth transistor grounded on a source side; and
        a first capacitor connecting a node between the drain of the first transistor and the source of the second transistor, and, the source of the third transistor.

2. The high-frequency amplifier circuitry according to claim 1, further comprising:
    an input matching circuit connecting to the gate of the first transistor and to an input terminal for the input signal; and
    an output matching circuit connecting to the drain of the second transistor, to the power supply voltage terminal, and to an output terminal.

3. The high-frequency amplifier circuitry according to claim 1, wherein:
the distortion compensation circuit further comprises a first resistor, the first resistor connecting the source of the fourth transistor and a ground point; and
a gate width of the fourth transistor is narrower than a gate width of the third transistor.

4. The high-frequency amplifier circuitry according to claim 3, wherein:
the distortion compensation circuit further comprises a second capacitor, the second capacitor connecting the node and the source of the fourth transistor; and
an electrostatic capacitance of the second capacitor is smaller than an electrostatic capacitance of the first capacitor.

5. The high-frequency amplifier circuitry according to claim 4, wherein:
the distortion compensation circuit further comprises:
a fifth transistor between the source of the fourth transistor and the first resistor, the fifth transistor having a drain and a gate which are connected to the source of the fourth transistor and a source which is connected to the first resistor; and
a third capacitor connecting the node and the source of the fifth transistor;
a gate width of the fifth transistor is narrower than the gate width of the fourth transistor; and
an electrostatic capacitance of the third capacitor is smaller than the electrostatic capacitance of the first capacitor.

6. The high-frequency amplifier circuitry according to claim 4, wherein:
the distortion compensation circuit further comprises:
a second resistor having a same resistance value as a resistance value of the first resistor, the second resistor connecting to the power supply voltage terminal;
a fifth transistor having a same gate width as the gate width of the fourth transistor, and having a drain and a gate which are connected to the power supply voltage terminal via the second resistor;
a sixth transistor having a same gate width as the gate width of the third transistor, and having a drain and a gate which are connected to the source of the fifth transistor and a source which is grounded;
a third capacitor having a same electrostatic capacitance as the electrostatic capacitance of the first capacitor, the third capacitor connecting the node and the source of the fifth transistor; and
a fourth capacitor having a same electrostatic capacitance as the electrostatic capacitance of the second capacitor, the fourth capacitor connecting the node and the drain of the fifth transistor.

7. The high-frequency amplifier circuitry according to claim 1, wherein:
the distortion compensation circuit further comprises a first resistor, the first resistor connecting the drain of the third transistor and the power supply voltage terminal; and
a gate width of the third transistor is narrower than a gate width of the fourth transistor.

8. The high-frequency amplifier circuitry according to claim 7, wherein:
the distortion compensation circuit further comprises a second capacitor, the second capacitor connecting the node and the drain of the third transistor; and
an electrostatic capacitance of the second capacitor is smaller than an electrostatic capacitance of the first capacitor.

9. The high-frequency amplifier circuitry according to claim 8, wherein:
the distortion compensation circuit further comprises:
a fifth transistor between the drain of the third transistor and the first resistor, the fifth transistor having a drain and a gate which are connected to the first resistor and a source which is connected to the drain of the third transistor; and
a third capacitor connecting the node and the drain of the fifth transistor;
a gate width of the fifth transistor is narrower than the gate width of the third transistor; and
an electrostatic capacitance of the third capacitor is smaller than the electrostatic capacitance of the first capacitor.

10. The high-frequency amplifier circuitry according to claim 2, wherein:
the distortion compensation circuit further comprises a first resistor, the first resistor connecting the source of the fourth transistor and a ground point; and
a gate width of the fourth transistor is narrower than a gate width of the third transistor.

11. The high-frequency amplifier circuitry according to claim 10 wherein:
the distortion compensation circuit further comprises a second capacitor, the second capacitor connecting the node and the source of the fourth transistor; and
an electrostatic capacitance of the second capacitor is smaller than an electrostatic capacitance of the first capacitor.

12. The high-frequency amplifier circuitry according to claim 11, wherein:
the distortion compensation circuit further comprises:
a fifth transistor between the source of the fourth transistor and the first resistor, the fifth transistor having a drain and a gate which are connected to the source of the fourth transistor and a source which is connected to the first resistor; and
a third capacitor connecting the node and the source of the fifth transistor;
a gate width of the fifth transistor is narrower than the gate width of the fourth transistor; and
an electrostatic capacitance of the third capacitor is smaller than the electrostatic capacitance of the first capacitor.

13. The high-frequency amplifier circuitry according to claim 11, wherein:
the distortion compensation circuit further comprises:
a second resistor having a same resistance value as a resistance value of the first resistor, the second resistor connecting to the power supply voltage terminal;
a fifth transistor having a same gate width as the gate width of the fourth transistor, and having a drain and a gate which are connected to the power supply voltage terminal via the second resistor;
a sixth transistor having a same gate width as the gate width of the third transistor, and having a drain and a gate which are connected to the source of the fifth transistor and a source which is grounded;
a third capacitor having a same electrostatic capacitance as the electrostatic capacitance of the first capacitor, the third capacitor connecting the node and the source of the fifth transistor; and a fourth capacitor having a same electrostatic capacitance as the electrostatic capacitance of the second capacitor, the fourth capacitor connecting the node and the drain of the fifth transistor.

14. The high-frequency amplifier circuitry according to claim 2, wherein:
the distortion compensation circuit further comprises a first resistor, the first resistor connecting the drain of the third transistor and the power supply voltage terminal; and
a gate width of the third transistor is narrower than a gate width of the fourth transistor.

15. The high-frequency amplifier circuitry according to claim 14, wherein:
the distortion compensation circuit further comprises a second capacitor, the second capacitor connecting the node and the source of the third transistor; and
an electrostatic capacitance of the second capacitor is smaller than an electrostatic capacitance of the first capacitor.

16. The high-frequency amplifier circuitry according to claim 15, wherein
the distortion compensation circuit further comprises:
a fifth transistor between the drain of the third transistor and the first resistor, the fifth transistor having a drain and a gate which are connected to the first resistor and a source which is connected to the drain of the third transistor; and
a third capacitor connecting the node and the drain of the fifth transistor;
a gate width of the fifth transistor is narrower than the gate width of the third transistor; and
an electrostatic capacitance of the third capacitor is smaller than the electrostatic capacitance of the first capacitor.

17. A semiconductor device comprising at least one high-frequency amplifier circuitry on a silicon on insulator (SOI) substrate,
the at least one high-frequency amplifier circuitry comprising:
an amplifier circuit, the amplifier circuit comprising:
a first transistor having a gate to which an input signal is applied;
an inductor having one terminal which is connected to a source of the first transistor and another terminal which is grounded; and
a second transistor having a source which is connected to a drain of the first transistor, a gate which is grounded, and a drain which is connected to a power supply voltage terminal, the second transistor configured to output from the drain a signal obtained by amplifying the input signal; and
a distortion compensation circuit, the distortion compensation circuit comprising:
a third transistor having a drain and a gate which are connected to each other, the third transistor connected to the power supply voltage terminal on the drain side;
a fourth transistor having a drain and a gate which are connected to a source of the third transistor, the fourth transistor grounded on a source side; and
a first capacitor connecting a node between the drain of the first transistor and the source of the second transistor, and, the source of the third transistor.

18. The semiconductor device according to claim 17, wherein the at least one high-frequency amplifier circuitry further comprises:
an input matching circuit connecting to the gate of the first transistor and to an input terminal for the input signal; and
an output matching circuit connecting to the drain of the second transistor, to the power supply voltage terminal, and to an output terminal.

* * * * *